US012211942B2

(12) United States Patent
Jeong et al.

(10) Patent No.: US 12,211,942 B2
(45) Date of Patent: Jan. 28, 2025

(54) SEMICONDUCTOR DEVICES

(71) Applicant: Samsung Electronics Co., Ltd., Suwon-si (KR)

(72) Inventors: Soojin Jeong, Bucheon-si (KR); Myunggil Kang, Suwon-si (KR); Junggil Yang, Hwaseong-si (KR); Junbeom Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 498 days.

(21) Appl. No.: 17/398,504

(22) Filed: Aug. 10, 2021

(65) Prior Publication Data

US 2022/0238723 A1    Jul. 28, 2022

(30) Foreign Application Priority Data

Jan. 27, 2021    (KR) ........................ 10-2021-0011700

(51) Int. Cl.
| | |
|---|---|
| *H01L 29/786* | (2006.01) |
| *H01L 21/02* | (2006.01) |
| *H01L 29/06* | (2006.01) |
| *H01L 29/423* | (2006.01) |
| *H01L 29/66* | (2006.01) |

(52) U.S. Cl.
CPC .... *H01L 29/78696* (2013.01); *H01L 21/0259* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78618* (2013.01)

(58) Field of Classification Search
CPC ........... H01L 29/78696; H01L 29/0665; H01L 29/42392; H01L 29/78618
See application file for complete search history.

(56) References Cited

U.S. PATENT DOCUMENTS

| | | |
|---|---|---|
| 9,741,811 B2 | 8/2017 | Hatcher et al. |
| 10,504,900 B2 | 12/2019 | Hashemi et al. |
| 2019/0378911 A1 | 12/2019 | Lee et al. |

(Continued)

FOREIGN PATENT DOCUMENTS

KR    10-2019-0140564 A    12/2019

*Primary Examiner* — Jay C Kim
*Assistant Examiner* — Woo K Lee
(74) *Attorney, Agent, or Firm* — HARNESS, DICKEY & PIERCE, P.L.C.

(57) ABSTRACT

A semiconductor device includes a first source/drain, a second source/drain isolated from direct contact with the first source/drain in a horizontal direction, a channel extending between the first source/drain and the second source/drain, a gate surrounding the channel, an upper inner spacer between the gate and the first source/drain and above the channel, and a lower inner spacer between the gate and the first source/drain and under the channel, in which the channel includes a base portion extending between the first source/drain and the second source/drain, an upper protrusion portion protruding upward from a top surface of the base portion, and a lower protrusion portion protruding downward from a bottom surface of the base portion, and a direction in which a top end of the upper protrusion portion is isolated from direct contact with a bottom end of the lower protrusion portion is oblique with respect to a vertical direction.

20 Claims, 19 Drawing Sheets

(56) References Cited

U.S. PATENT DOCUMENTS

| | | |
|---|---|---|
| 2019/0393350 A1 | 12/2019 | Thompson et al. |
| 2020/0006333 A1 | 1/2020 | Noh et al. |
| 2020/0066839 A1 | 2/2020 | Zhang et al. |
| 2020/0075716 A1 | 3/2020 | Wang et al. |
| 2020/0091152 A1 | 3/2020 | Noh et al. |
| 2020/0105929 A1 | 4/2020 | Zhang et al. |
| 2021/0035870 A1* | 2/2021 | Young ............... H01L 29/78696 |
| 2021/0066294 A1* | 3/2021 | Huang ............... H01L 29/66818 |
| 2021/0336034 A1* | 10/2021 | Wu ..................... H01L 29/7853 |
| 2021/0399099 A1* | 12/2021 | Chu ................... H01L 29/78618 |

\* cited by examiner

SEMICONDUCTOR DEVICES

CROSS-REFERENCE TO RELATED APPLICATION

This application is based on and claims priority under 35 U.S.C. § 119 to Korean Patent Application No. 10-2021-0011700, filed on Jan. 27, 2021, in the Korean Intellectual Property Office, the disclosure of which is incorporated by reference herein in its entirety.

BACKGROUND

The inventive concepts relate to semiconductor devices. More particularly, the inventive concepts relate to a nanosheet field-effect transistors.

To improve the degree of integration of semiconductor devices, sizes of transistors need to be reduced. However, such size reduction of the transistors causes short channel effects.

SUMMARY

The inventive concepts provide a nanosheet field-effect transistor in which short channel effects are reduced, the nanosheet field-effect transistor related to alleviating short channel effects, for example a fin field-effect transistor (FinFET) in which a gate is contact with three surfaces of a channel and/or in which a gate surrounds four surfaces of a channel.

According to some example embodiments of the inventive concepts, a semiconductor device may include a first source/drain, a second source/drain isolated from direct contact with the first source/drain in a horizontal direction, a channel extending between the first source/drain and the second source/drain, a gate surrounding the channel, an upper inner spacer between the gate and the first source/drain and above the channel, and a lower inner spacer between the gate and the first source/drain and under the channel, in which the channel includes a base portion extending between the first source/drain and the second source/drain, an upper protrusion portion protruding upward from a top surface of the base portion, and a lower protrusion portion protruding downward from a bottom surface of the base portion, and a direction in which a top end of the upper protrusion portion is isolated from direct contact with a bottom end of the lower protrusion portion is oblique with respect to a vertical direction that is perpendicular to the horizontal direction.

According to some example embodiments of the inventive concepts, a semiconductor device may include a first source/drain, a second source/drain isolated from direct contact with the first source/drain in a horizontal direction, a channel extending between the first source/drain and the second source/drain, a gate surrounding the channel, a first upper inner spacer between the gate and the first source/drain and above the channel, a second upper inner spacer between the gate and the second source/drain and above the channel, a first lower inner spacer between the gate and the first source/drain and under the channel, and a second lower inner spacer between the gate and the second source/drain and under the channel, in which the channel includes a base portion extending between the first source/drain and the second source/drain, first and second upper protrusion portions each protruding upward from a top surface of the base portion, and first and second lower protrusion portions each protruding downward from a bottom surface of the base portion, and a distance in the horizontal direction between a top end of the first upper protrusion portion and a top end of the second upper protrusion portion is less than a distance in the horizontal direction between a bottom end of the first lower protrusion portion and a bottom end of the second lower protrusion portion.

According to some example embodiments of the inventive concepts, a semiconductor device may include a first source/drain, a second source/drain isolated from direct contact with the first source/drain in a horizontal direction, a lower channel extending between the first source/drain and the second source/drain, an upper channel extending between the first source/drain and the second source/drain and isolated from direct contact with the lower channel in a vertical direction, a gate surrounding the lower channel and the upper channel, a first inner spacer between the gate and the first source/drain and between the lower channel and the upper channel, and a second inner spacer between the gate and the second source/drain and between the lower channel and the upper channel, in which the lower channel includes a lower base portion extending between the first source/drain and the second source/drain, an upper protrusion portion protruding upward from a top surface of the lower base portion, and a first lower protrusion portion protruding downward from a bottom surface of the base portion, and a direction in which a top end of the upper protrusion portion is isolated from direct contact with a bottom end of the first lower protrusion portion is oblique with respect to the vertical direction.

A direction in which a top end of the upper protrusion portion is apart from a bottom end of the first lower protrusion portion may be oblique with respect to the vertical direction.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
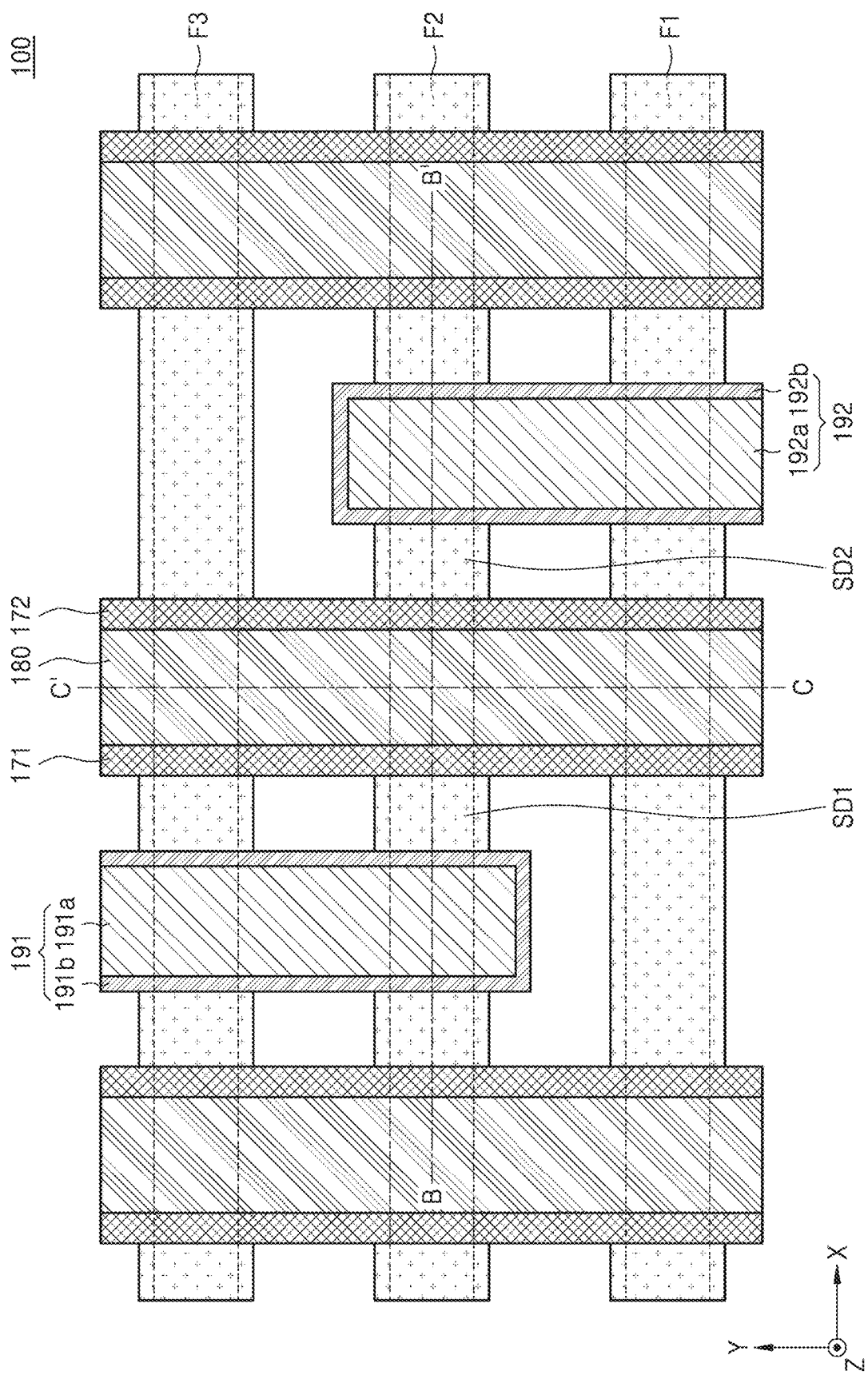
FIG. 1A is a plane view of a semiconductor device according to some example embodiments of the inventive concepts.

Hereinafter, example embodiments will hereinafter be described in detail, and may be easily performed by a person having an ordinary skill in the related art. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or under or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1B:
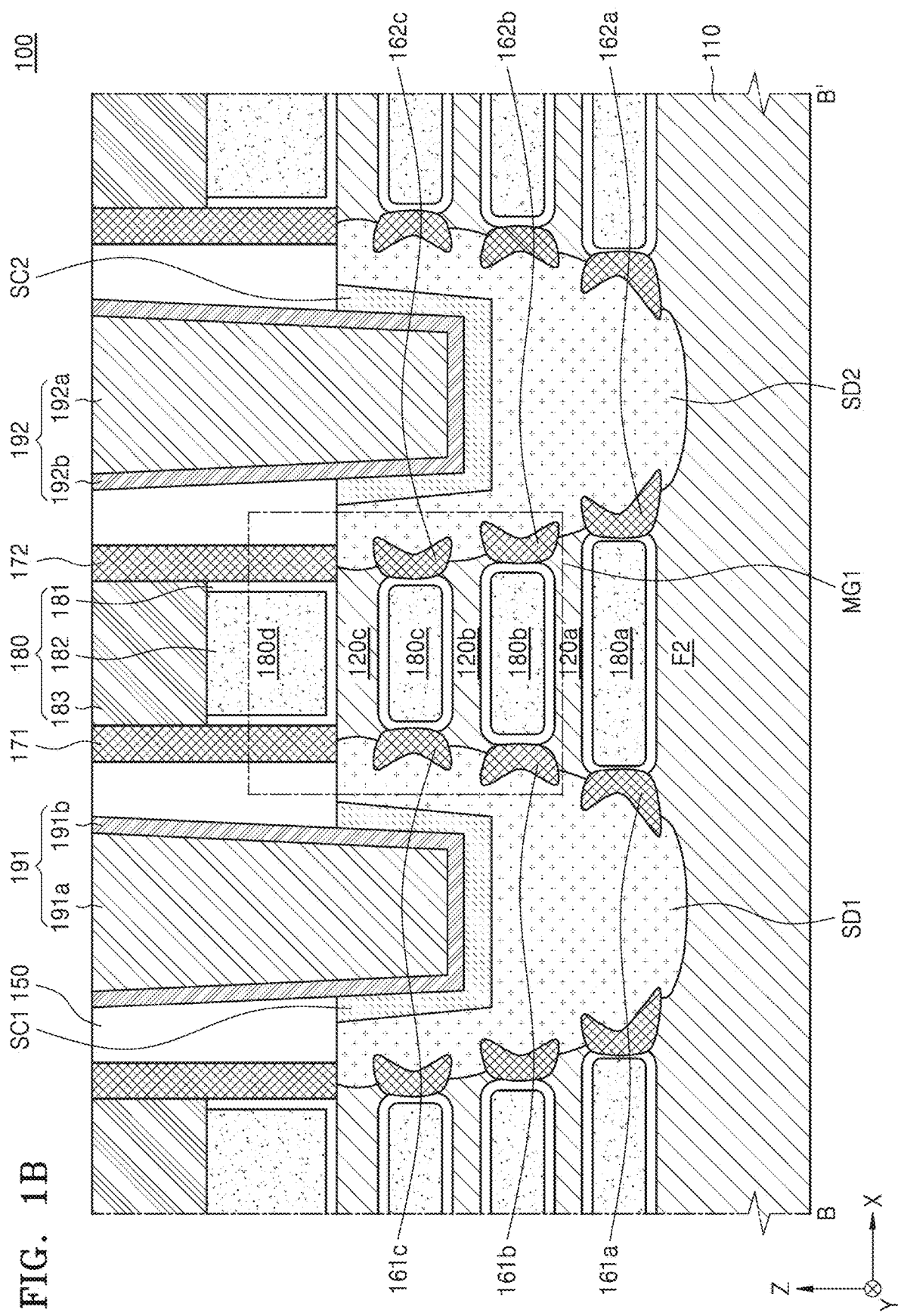
FIG. 1B is a cross-sectional view of a semiconductor device according to some example embodiments of the inventive concepts, taken along a line B-B' of FIG. 1A.
Figure 1C:
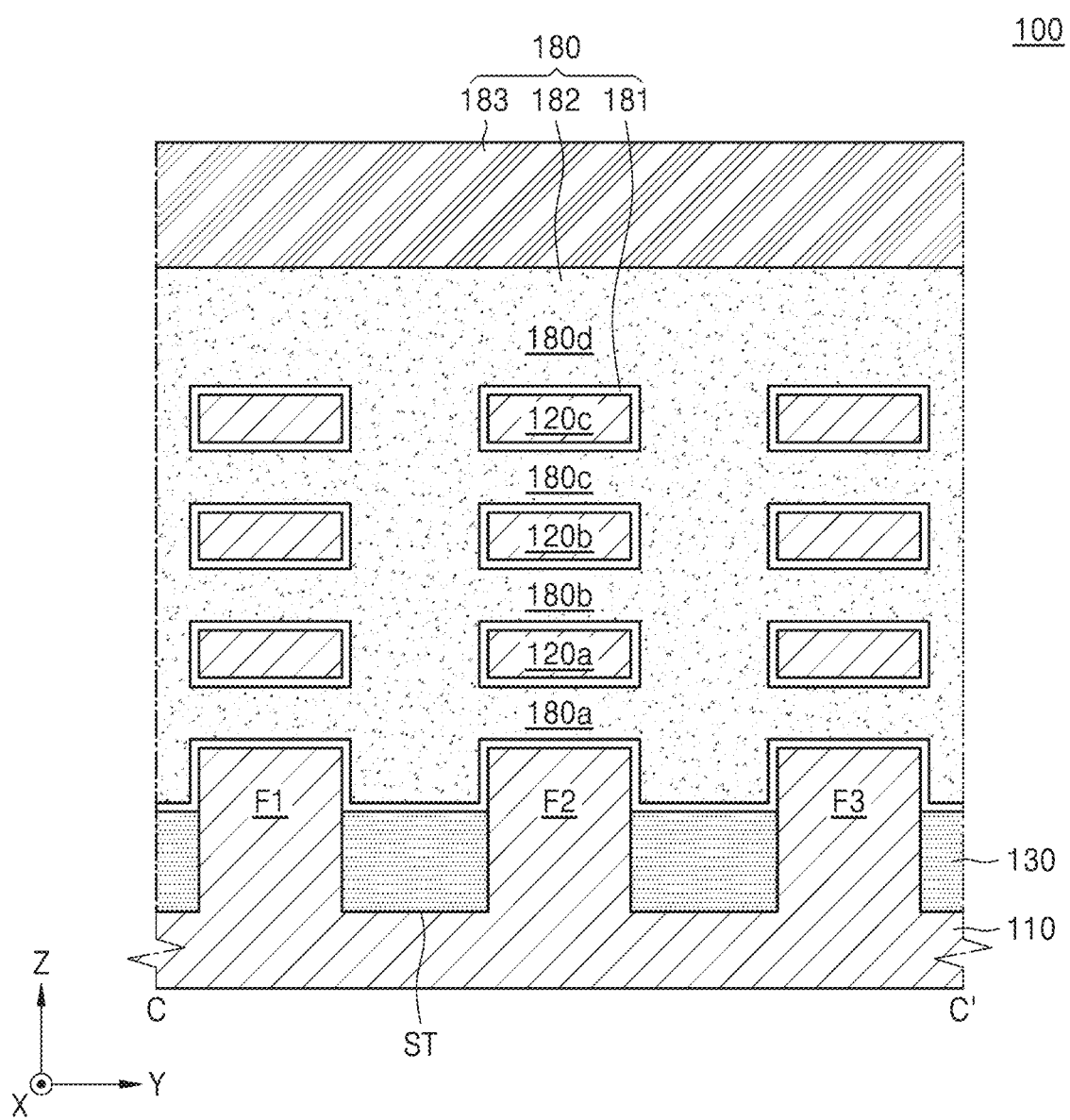
FIG. 1C is a cross-sectional view of a semiconductor device according to some example embodiments of the inventive concepts, taken along a line C-C' of FIG. 1A.

FIG. 1A is a plane view of a semiconductor device according to some example embodiments of the inventive concepts. FIG. 1B is a cross-sectional view of a semiconductor device according to some example embodiments of the inventive concepts, taken along a line B-B' of FIG. 1A. FIG. 1C is a cross-sectional view of a semiconductor device according to some example embodiments of the inventive concepts, taken along a line C-C' of FIG. 1A.

Referring to FIGS. 1A through 1C, a semiconductor device 100 may include a substrate 110, a first source/drain SD1 and a second source/drain SD2 on the substrate 110, a plurality of first through third channels 120a through 120c extending between the first source/drain SD1 and the second source/drain SD2, a gate 180 surrounding the plurality of channels 120a through 120c, two first and second spacers 171 and 172 on opposite side surfaces of the gate 180, a plurality of first through third left inner spacers 161a through 161c on the left side surface of the gate 180, and first through third right inner spacers 162a through 162c on the right side surface of the gate 180.

The substrate 110 may include a semiconductor material such as a IV group semiconductor material, a III-V group semiconductor material, or a II-VI group semiconductor material. The IV group semiconductor material may include, for example, silicon (Si), germanium (Ge), or silicon (Si)-germanium (Ge). The III-V group semiconductor material may include, for example, gallium arsenide (GaAs), indium phosphorus (InP), gallium phosphorus (GaP), indium arsenide (InAs), indium antimony (Sb), or indium gallium arsenide (InGaAs). The II-VI group semiconductor material may include, for example, zinc telluride (ZnTe) or cadmium sulfide (CdS). The substrate 110 may be a bulk wafer or epitaxial layer.

A plurality of fin-type active regions F1 through F3 may protrude from the substrate 110 in a vertical direction Z. The plurality of fin-type active regions F1 through F3 may extend in parallel with one another in a first horizontal direction X. Each of the plurality of fin-type active regions F1 through F3 may be defined by an isolation or shallow trench ST formed in the substrate 110.

The semiconductor device 100 may further include an isolating insulation layer 130 in the isolation trench ST. The isolating insulation layer 130 may cover a side surface of a lower portion of each of the fin-type active regions F1 through F3. An upper portion of each of the fin-type active regions F1 through F3 may protrude from the isolating insulation layer 130. The isolating insulation layer 130 may be arranged between the substrate 110 and the gate 180. The isolating insulation layer 130 may include a silicon oxide, a silicon nitride, or a combination thereof.

The isolating insulation layer 130 may include a plurality of layers in some example embodiments of the inventive concepts. For example, the isolating insulation layer 130 may include a first insulation liner (not shown), a second insulation liner (not shown), and a buried insulation layer (not shown). The first insulation liner may include, for example, a silicon oxide, and the second insulation liner may include, for example, a silicon nitride. The buried insulation layer may include a silicon oxide or a silicon nitride.

The first source/drain SD1 and the second source/drain SD2 may be on the substrate 110 and may contact the plurality of channels 120a, 120b, and 120c. While it is illustrated in FIG. 1B that top ends of the first source/drain SD1 and the second source/drain SD2 are in the same vertical direction Z level as top ends of the third channels 120c, the vertical direction Z level of the top ends of the first source/drain SD1 and the second source/drain SD2 may be higher than the vertical direction Z level of the top ends of the third channels 120c in some example embodiments of the inventive concepts. The second source/drain SD2 may be apart from the first source/drain SD1 in the first horizontal direction X. It will be understood that an element that described herein to be "apart from" another element (e.g., apart from the other element in a certain direction) may be isolated from direct contact with the other element (e.g., isolated from direct contact with the other element in the certain direction).

The first source/drain SD1 and the second source/drain SD2 may include a semiconductor material such as a IV group semiconductor material, a III-V group semiconductor material, or a II-VI group semiconductor material. The IV group semiconductor material may include, for example, silicon (Si), germanium (Ge), or silicon (Si)-germanium (Ge). The III-V group semiconductor material may include, for example, gallium arsenide (GaAs), indium phosphorus (InP), gallium phosphorus (GaP), indium arsenic (InAs), indium antimony (Sb), or indium gallium arsenide (InGaAs). The II-VI group semiconductor material may include, for example, zinc telluride (ZnTe) or cadmium sulfide (CdS). In some example embodiments of the inventive concepts, each of the first source/drain SD1 and the second source/drain SD2 may include Si doped with an n-type dopant or SiC doped with an n-type dopant. The n-type dopant may include, for example, phosphorus (P), arsenic (As), antimony (Sb), or a combination thereof.

The plurality of channels 120a through 120c may be respectively arranged on the fin-type active regions F1 through F3 and each may extend between the first source/drain SD1 and the second source/drain SD2. The first channel 120a may be separated from each fin-type active region F1 in the vertical direction Z, the second channel 120b (also referred to herein as a lower channel) may be separated from (e.g., isolated from direct contact with) the first channel 120a in the vertical direction Z, and the third channel 120c (also referred to herein as an upper channel) may be separated from (e.g., isolated from direct contact with) the second channel 120b in the vertical direction Z. Although it is illustrated in FIGS. 1B and 1C that three channels 120a through 120c are arranged in the vertical direction Z, the number of channels arranged in the vertical direction Z is not limited to three. Each of the channels 120a through 120c may be referred to as a nanosheet or a nanowire. Each of the channels 120a through 120c may extend between the first source/drain SD1 and the second source/drain SD2 in the first horizontal direction X.

Each of the channels 120a through 120c may include a semiconductor material such as a IV group semiconductor material, a III-V group semiconductor material, or a II-VI group semiconductor material. The IV group semiconductor material may include, for example, silicon (Si), germanium (Ge), or silicon (Si)-germanium (Ge). The III-V group semiconductor material may include, for example, gallium arsenide (GaAs), indium phosphorus (InP), gallium phosphorus (GaP), indium arsenic (InAs), indium antimony (Sb), or indium gallium arsenide (InGaAs). The II-VI group semiconductor material may include, for example, zinc telluride (ZnTe) or cadmium sulfide (CdS).

Each gate 180 may cover the plurality of fin-type active regions F1 through F3 and surround the plurality of channels 120a through 120c. For example, for each channel extending between the first source/drain SD1 and the second source/drain SD2 (e.g., channel 120C), a gate 180 may surround said channel in at least the vertical direction Z and the second horizontal direction Y, for example as shown in FIGS. 1A-1C. As shown, the gate 180 may surround at least the second channel 120b and the third channel 120c in at least the vertical direction Z and the second horizontal direction Y, for example as shown in FIGS. 1A-1C. Each gate 180 may extend in the second horizontal direction Y. The gate 180 may include a gate electrode 182, a gate insulation layer 181, and a gate capping layer 183.

The gate electrode 182 may cover the plurality of fin-type active regions F1 through F3, surround the plurality of channels 120a through 120c, and extend in the second horizontal direction Y. The gate electrode 182 may include metal, a metal nitride, a metal carbide, or a combination thereof. The metal may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. The metal nitride may include titanium (TiN), tantalum (TaN), or a combination thereof. The metal carbide may include titanium aluminum carbide (TiAlC).

In some example embodiments of the inventive concepts, the gate electrode 182 may have a structure in which a metal nitride, a metal layer, a conductive capping layer, and a gap-fill metal layer are sequentially stacked. The metal nitride and the metal layer may include titanium (Ti), tantalum (Ta), tungsten (W), ruthenium (Ru), niobium (Nb), molybdenum (Mo), hafnium (Hf), or a combination thereof. The gap-fill metal layer may include tungsten (W), aluminum (Al), or a combination thereof. The gate electrode 182 may include at least one work function metal layer. The at least one work function metal layer may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. In some example embodiments of the inventive concepts, the gate electrode 182 may include a stack structure of TiAlC/TiN/W, a stack structure of TiN/TaN/TiAlC/TiN/W, or a stack structure of TiN/TaN/TiN/TiAlC/TiN/W.

The gate insulation layer 181 may be between the plurality of channels 120a through 120c and the gate electrode 182, between the plurality fin-type active regions F1 through F3 and the gate electrode 182, and between the isolating insulation layer 130 and the gate electrode 182. In some example embodiments of the inventive concepts, the gate insulation layer 181 may further extend between the first spacer 171 and the gate electrode 182 and between the second spacer 172 and the gate electrode 182.

The gate insulation layer 181 may include a high-dielectric material. The high-dielectric material may mean a material having a dielectric constant that is greater than that of a silicon oxide. For example, the high-dielectric material may have a dielectric constant of about 10 to 25. The high-dielectric material may include, for example, a hafnium oxide ($HfO_2$), a hafnium silicon oxide ($HfSiO_4$), a zirconium oxide ($ZrO_2$), an aluminum oxide ($Al_2O_3$), a titanium oxide ($TiO_2$), a tantalum oxide ($Ta_2O_5$), a lanthanum oxide ($La_2O_3$), a niobium oxide ($Nb_2O_5$), or a combination thereof.

The gate capping layer 183 may cover top ends of the gate electrode 182 and the gate insulation layer 181 and may be between the first spacer 171 and the second spacer 172. The gate capping layer 183 may extend in the second horizontal direction Y. The gate capping layer 183 may include a silicon nitride, a silicon oxide, or a combination thereof.

The gate 180 may include a first portion 180a between a fin-type active region F2 and the first channel 120a, a second portion 180b between the first channel 120a and the second channel 120b, a third portion 180c between the second channel 120b and the third channel 120c, and a fourth portion 180d on the third channel 120c, on a cut-away view that is parallel to the first horizontal direction X and the vertical direction Z, i.e., on an XZ plane.

On opposite side surfaces of the fourth portion 180d of the gate 180, the first spacer 171 and the second spacer 172 may be arranged, respectively. The first spacer 171 and the second spacer 172 may include a silicon nitride, a silicon oxide, a silicon carbonitride (SicN), a silicon boron nitride (SiBN), a silicon oxycarbonitride (SiOCN), a silicon boroncarbonitride (SiBCN), a silicon oxycarbide (SiOC), or a combination thereof.

The first left inner spacer 161a may be between the first portion 180a of the gate 180 and the first source/drain SD1 and between the fin-type active region F2 and the first channel 120a. The first right inner spacer 162a may be between the first portion 180a of the gate 180 and the second source/drain SD2 and between the fin-type active region F2 and the first channel 120a.

The second left inner spacer 161b may be between the second portion 180b of the gate 180 and the first source/drain SD1 and between the first channel 120a and the second channel 120b. The second left inner spacer 161b may be referred to herein as a lower inner spacer and/or a first lower inner spacer that is between the gate 180 and the first source/drain SD1 and is "under" the second channel 120b. The second right inner spacer 162b may be between the second portion 180b of the gate 180 and the second source/drain SD2 and between the first channel 120a and the second channel 120b. The second right inner spacer 162b may be referred to herein as a second lower inner spacer that is between the gate 180 and the second source/drain SD2 and is "under" the second channel 120b.

The third left inner spacer 161c may be between the third portion 180c of the gate 180 and the first source/drain SD1 and between the second channel 120b and the third channel 120c. The third left inner spacer 161c may be referred to herein as an upper inner spacer and/or a first upper inner spacer that is between the gate 180 and the first source/drain SD1 and is "above" the second channel 120b. The third right inner spacer 162c may be between the third portion 180c of the gate 180 and the second source/drain SD2 and between the second channel 120b and the third channel 120c. The third right inner spacer 162c may be referred to herein as a second upper inner spacer that is between the gate 180 and second first source/drain SD2 and is "above" the second channel 120b.

Each of the left inner spacers 161a through 161c and the right inner spacers 162a through 162c may include a silicon nitride, a silicon oxide, a silicon carbonitride (SiCN), a silicon boron nitride (SiBN), a silicon oxycarbonitride (SiOCN), a silicon boroncarbonitride (SiBCN), a silicon oxycarbide (SiOC), or a combination thereof.

The semiconductor device 100 may further include an inter-gate insulation layer 150 that covers the first source/drain SD1 and the second source/drain SD2 and fills a space between adjacent gates 180. The inter-gate insulation layer 150 may include a silicon nitride, a silicon oxide, or a combination thereof.

In some example embodiments of the inventive concepts, the semiconductor device 100 may further include an insulating liner (not shown) between the first source/drain SD1 and the inter-gate insulation layer 150 and between the second source/drain SD2 and the inter-gate insulation layer 150, and between the first spacer 171 and the inter-gate insulation layer 150 and the second spacer 172 and the inter-gate insulation layer 150. The insulating liner may include a silicon nitride, a silicon carbonitride (SiCN), a silicon boron nitride (SiBN), a silicon oxycarbonitride (SiOCN), a silicon boroncarbonitride (SiBCN), a silicon oxycarbide (SiOC), a silicon oxide ($SiO_2$), or a combination thereof.

The semiconductor device 100 may further include a first contact 191 that passes through an inter-gate insulation layer 150 in the vertical direction Z to contact the first source/drain SD1 and a second contact 192 that passes through the inter-gate insulation layer 150 in the vertical direction Z to contact the second source/drain SD2. The first contact 191 may include a first metal layer 191a and a first barrier layer 191b on a side surface and a bottom surface of the first metal layer 191a. Likewise, the second contact 192 may include a second metal layer 192a and a second barrier layer 192b on a side surface and a bottom surface of the second metal layer 192a. The first metal layer 191a and the second metal layer 192a may include tungsten (W), cobalt (Co), copper (Cu), ruthenium (Ru), manganese (Mn), aluminum (Al), silver (Ag), gold (Au), or a combination thereof. The first barrier layer 191b and the second barrier layer 192b may include titanium (Ti), tantalum (Ta), a titanium nitride (TiN), a tantalum nitride (TaN), or a combination thereof.

In some example embodiments of the inventive concepts, the semiconductor device 100 may further include a first metal silicide layer SC1 between the first source/drain SD1 and the first contact 191 and a second metal silicide layer SC2 between the second source/drain SD2 and the second contact 192. Each of the first metal silicide layer SC1 and the second metal silicide layer SC2 may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. For example, each of the first metal silicide layer SC1 and the second metal silicide layer SC2 may include a titanium silicide.

In some example embodiments of the inventive concepts, the first source/drain SD1, the second source/drain SD2, the plurality of channels 120a through 120c, the gate 180, the spacers 171 and 172, the left inner spacers 161a through 161c, and the right inner spacers 162a through 162c may form an n-type field effect transistor (NFET). In some example embodiments of the inventive concepts, the semiconductor device 100 may further include a p-type field effect transistor (PFET) (not shown). The PFET may not include the left inner spacers 161a through 161c and the right inner spacers 162a through 162c. Thus, the shapes of channels of the PFET may be different from the shapes of the channels 120a through 120c of the NFET.

Figure 1D:
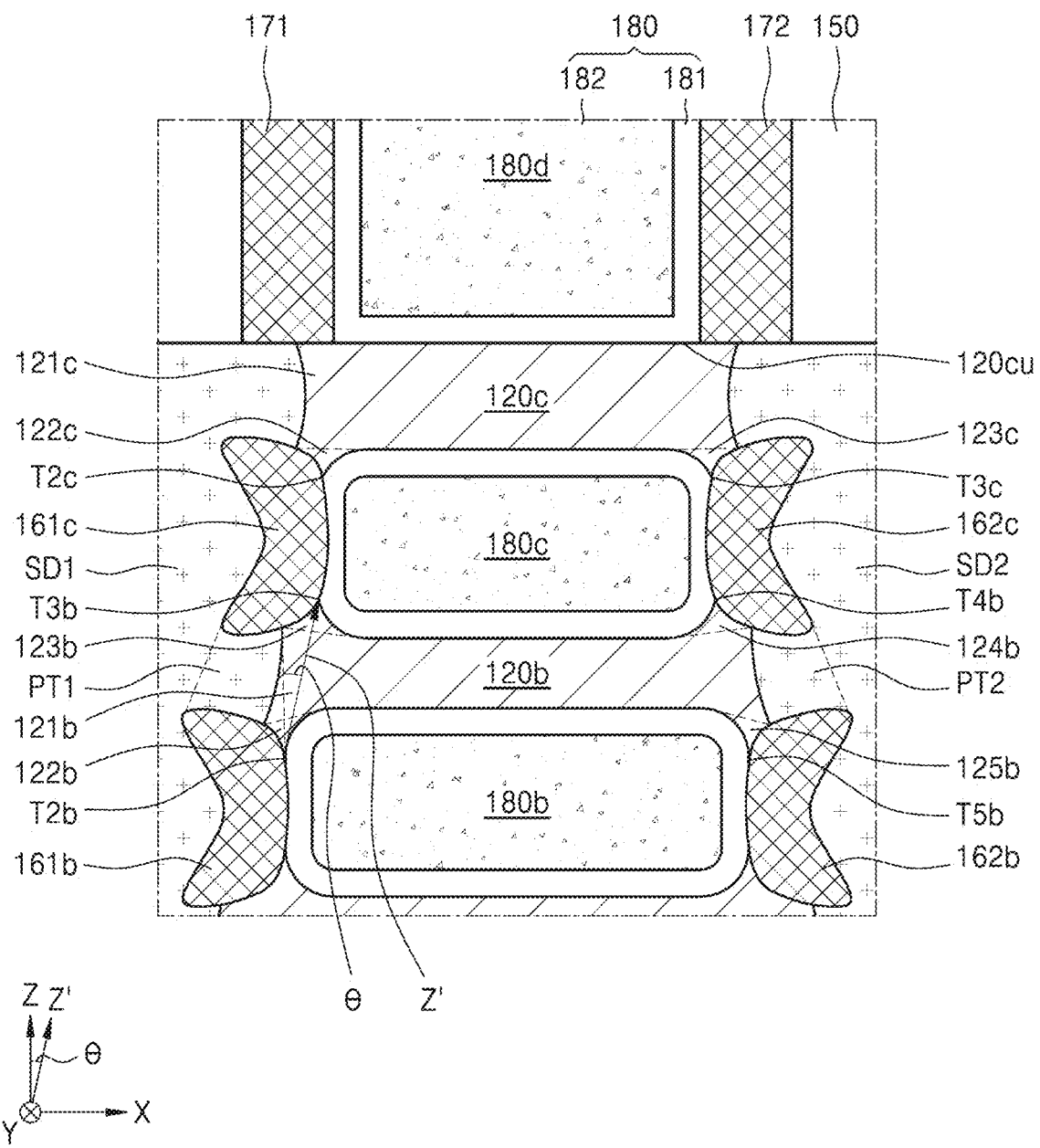
FIGS. 1D, 1E, and 1F each are enlarged views of a region MG1 of FIG. 1B.
Figure 1E:
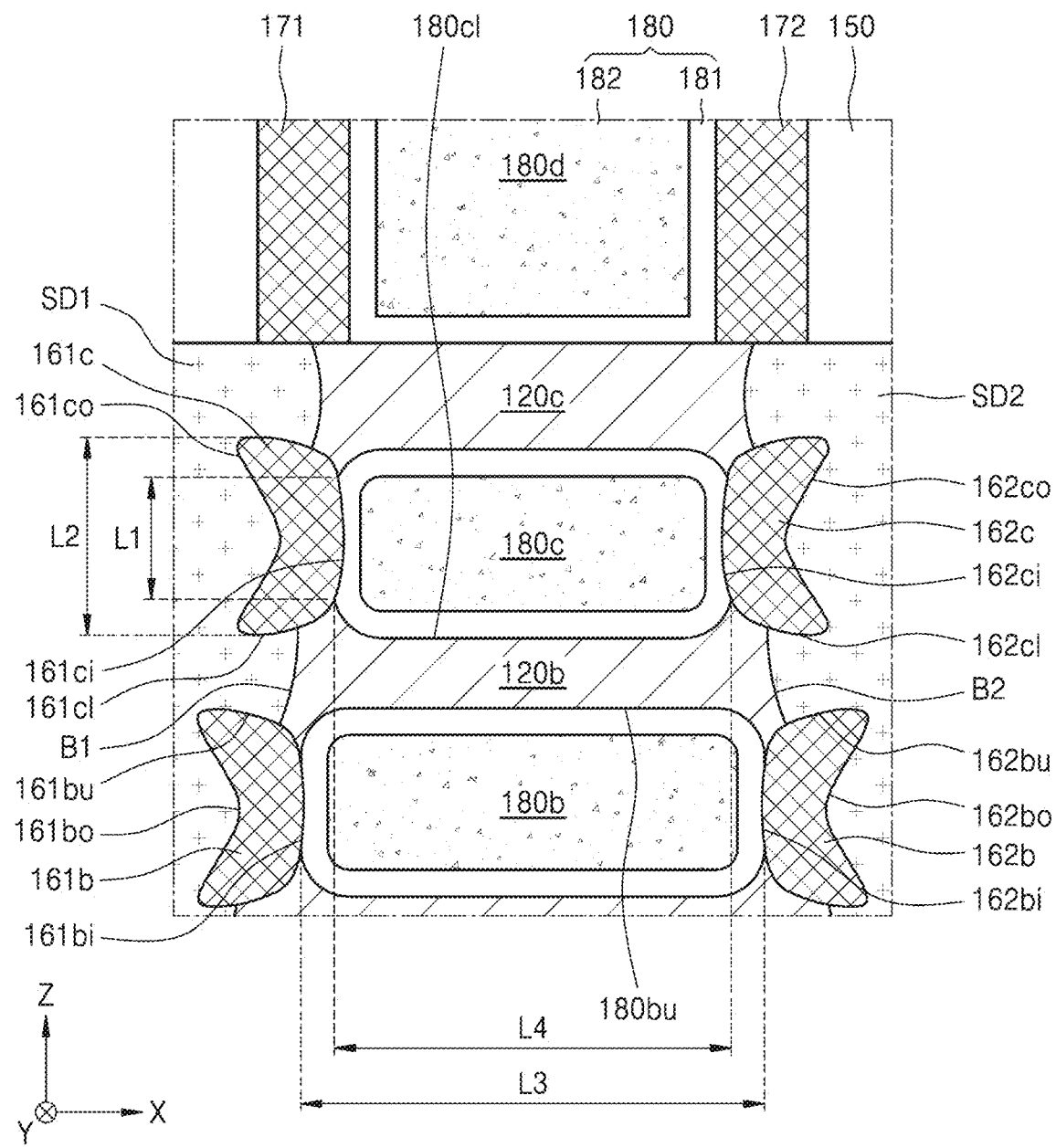
Figure 1F:
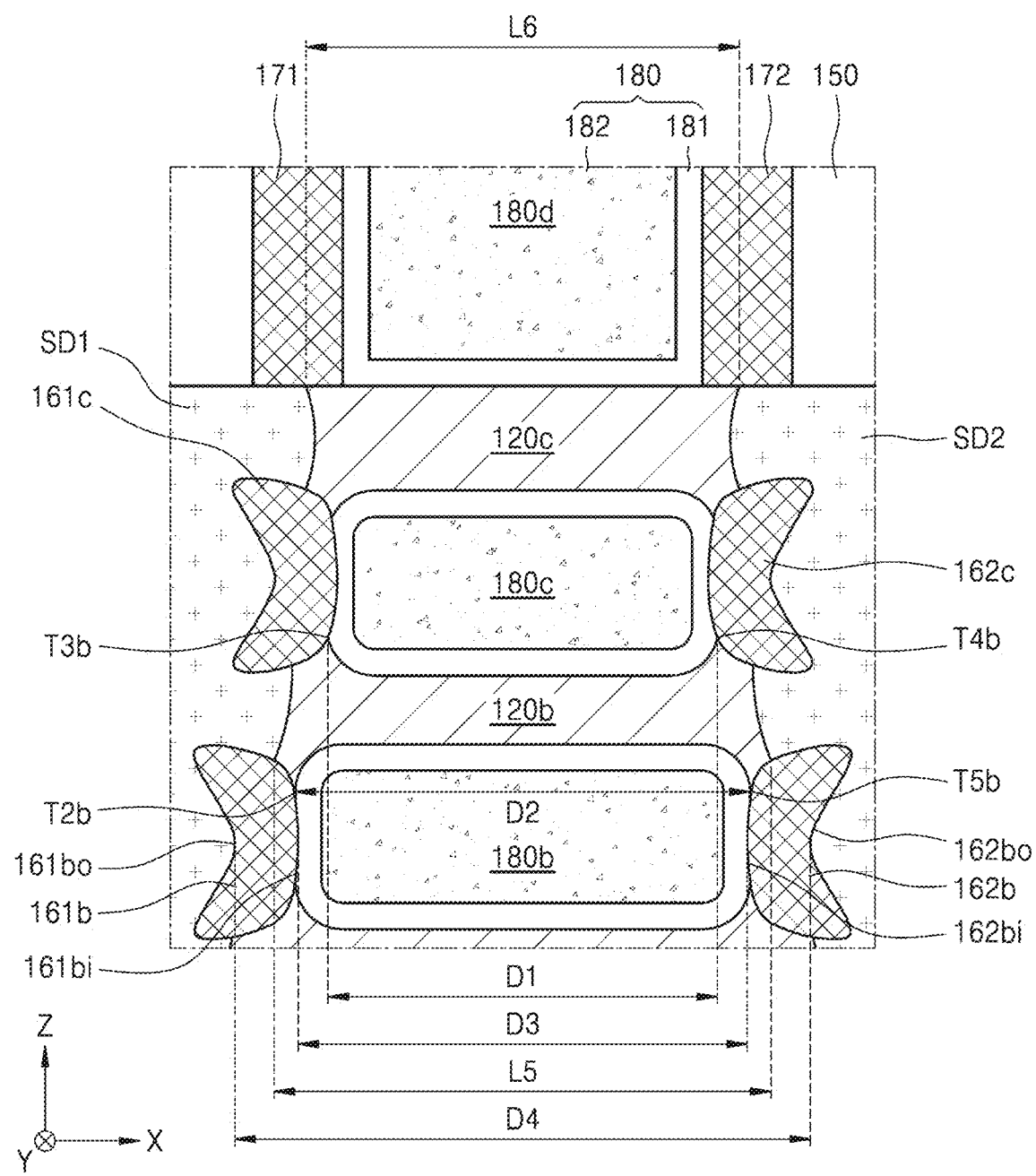

FIGS. 1D through 1F each are enlarged views of a region MG1 of FIG. 1B. FIGS. 1D through 1F are enlarged views of a cross-section that is parallel to the first horizontal direction X and the vertical direction Z, i.e., the XZ plane.

Referring to FIG. 1D, the second channel 120b may include a first base portion 121b extending between the first source/drain SD1 and the second source/drain SD2, first and second upper protrusion portions 123b and 124b (which may be separately referred to as an upper protrusion portion of the second channel 120b) each protruding upward from a top surface of the first base portion 121b, and first and second lower protrusion portions 122b and 125b (which may be separately referred to as a lower protrusion portion of the second channel 120b) each protruding downward from a bottom surface of the first base portion 121b. Boundaries between the first base portion 121b and the upper protrusion portions 123b and 124b and boundaries between the first base portion 121b and the lower protrusion portions 122b and 125b may be virtual boundaries. That is, the lower protrusion portions 122b and 125b and the upper protrusion portions 123b and 124b may be formed integrally with the first base portion 121b.

The first upper protrusion portion 123b may contact the third left inner spacer 161c and the third portion 180c of the gate 180 (e.g., may contact the aforementioned upper inner spacer and the gate 180). Moreover, the first upper protrusion portion 123b may be defined by the third left inner spacer 161c, the third portion 180c of the gate 180, and the first base portion 121b. The first upper protrusion portion 123b may be a triangle in the cut-away view parallel to the XZ plane. Restated, in a cross-sectional view where the semiconductor device 100 is cut away in parallel to the first horizontal direction X and the vertical direction Z, for example the cross-sectional view shown in at least FIG. 1D, the first upper protrusion portion 123b (also referred to herein as simply an upper protrusion portion of a channel (e.g., second channel 120b) may be a triangle.

The second upper protrusion portion 124b may contact the third right inner spacer 162c and the third portion 180c of the gate 180. Moreover, the second upper protrusion portion 124b may be defined by the third right inner spacer 162c, the third portion 180c of the gate 180, and the first base portion 121b. The second upper protrusion portion 124b may be a triangle in the cut-away view parallel to the XZ plane.

The first lower protrusion portion 122b may contact the second left inner spacer 161b and the second portion 180b of the gate 180 (e.g., may contact the aforementioned lower inner spacer and the gate 180). Moreover, the first lower protrusion portion 122b may be defined by the second left inner spacer 161b, the second portion 180b of the gate 180, and the first base portion 121b. The first lower protrusion portion 122b may be a triangle in the cut-away view parallel to the XZ plane. Restated, in a cross-sectional view where the semiconductor device 100 is cut away in parallel to the first horizontal direction X and the vertical direction Z, for example the cross-sectional view shown in at least FIGS. 1D-1E, the first lower protrusion portion 122b (also referred to herein as simply a lower protrusion portion of a channel (e.g., second channel 120b) may be an inverted triangle.

The second lower protrusion portion 125b may contact the second right inner spacer 162b and the second portion 180b of the gate 180. Moreover, the second lower protrusion portion 125b may be defined by the second right inner spacer 162b, the second portion 180b of the gate 180, and the first base portion 121b. The second lower protrusion portion 125b may be an inverted triangle in the cut-away view parallel to the XZ plane.

The thickness of the second channel 120b in the vertical direction Z may increase in a direction −X opposite to the first horizontal direction X from the center of the second channel 120b to a top end T3b of the first upper protrusion portion 123b and/or a bottom end T2b of the first lower protrusion portion 122b and decrease in the direction −X opposite to the first horizontal direction X from the top end T3b of the first upper protrusion portion 123b and/or the bottom end T2b of the first lower protrusion portion 122b to a left end of the second channel 120b. The thickness of the second channel 120b in the vertical direction Z may increase in the first horizontal direction X from the center of the second channel 120b to a top end T4b of the second upper protrusion portion 124b and/or a bottom end T5b of the second lower protrusion portion 125b and decrease in the first horizontal direction X from the top end T4b of the second upper protrusion portion 124b and/or the bottom end T5b of the second lower protrusion portion 125b to a left end of the second channel 120b. As the thickness of an end portion of the second channel 120b decreases, an influence of the gate 180 upon the end portion of the second channel 120b may increase, thus reducing the short channel effects.

A direction in which the top end T3b of the first upper protrusion portion 123b is apart from (e.g., isolated from direct contact with) the bottom end T2b of the first lower protrusion portion 122b may be oblique with respect to the vertical direction Z, which is perpendicular to the first and second horizontal directions X and Y. A direction Z' in which the top end T3b of the first upper protrusion portion 123b is apart from the bottom end T2b of the first lower protrusion portion 122b may be oblique with respect to the vertical direction Z. For example, a direction Z' in which the top end T3b of the first upper protrusion portion 123b is apart from the bottom end T2b of the first lower protrusion portion 122b may incline at an angle θ about 5 degrees to 85 degrees, e.g., 10 degrees to 80 degrees, e.g., 15 degrees to 75 degrees, e.g., 20 degrees to 70 degrees, e.g., 25 degrees to 65 degrees, e.g., 30 degrees to 60 degrees, with respect to the vertical direction Z. Likewise, a direction in which the top end T4b of the second upper protrusion portion 124b is apart from the bottom end T5b of the second lower protrusion portion 125b may be oblique with respect to the vertical direction Z.

In some example embodiments of the inventive concepts, a direction in which the top end T3b of the first upper protrusion portion 123b is apart from the top end T4b of the second upper protrusion portion 124b may be oblique with respect to the first horizontal direction X. A direction in which the top end T2b of the first lower protrusion portion 122b is apart from the bottom end T5b of the second lower protrusion portion 125b may be parallel to the first horizontal direction X.

In some example embodiments of the inventive concepts, an end portion PT1 of the first source/drain SD1 contacting the second channel 120b may protrude between the third left inner spacer 161c and the second left inner spacer 161b such that the end portion PT1 is at least partially between the third left inner spacer 161c and the second left inner spacer 161b in the vertical direction Z. Similarly, an end portion PT2 of the second source/drain SD2 contacting the second channel 120b may protrude between the third right inner spacer 162c and the second right inner spacer 162b such that the end portion PT2 is at least partially between the third right inner spacer 162c and the second right inner spacer 162b in the vertical direction Z.

Thus, on the plane view, i.e., an XY plane, the left inner spacers 161c and 161b may overlap the first source/drain SD1 and the right inner spacers 162c and 162b may overlap the second source/drain SD2. That is, on the XY plane, projection of the left inner spacers 161c and 161b may overlap projection of the first source/drain SD1 on the XY plane and projection of the right inner spacers 162c and 162b may overlap projection of the second source/drain SD2 on the XY plane.

The third channel 120c may include a second base portion 121c extending between the first source/drain SD1 and the second source/drain SD2, and lower protrusion portions 122c and 123c protruding downward from a bottom surface of the second base portion 121c. A boundary between the second base portion 121c and each of the lower protrusion portions 122c and 123c may be a virtual boundary. That is, the lower protrusion portions 122c and 123c may be formed integrally with the second base portion 121c.

In some example embodiments of the inventive concepts, a top surface 120cu of the third channel 120c (e.g., upper channel) may be flat. That is, the third channel 120c may not include upper protrusion portions protruding upward from a top surface of the second base portion 121c. In some example embodiments, the first and second horizontal directions X and Y may be parallel to the top surface 120cu and the vertical direction Z may be perpendicular to the top surface 120cu.

The third lower protrusion portion 122c may contact the third left inner spacer 161c and the third portion 180c of the gate 180. Moreover, the third lower protrusion portion 122c may be defined by the third left inner spacer 161c, the third portion 180c of the gate 180, and the second base portion 121c. The third lower protrusion portion 122c may be an inverted triangle in the cut-away view parallel to the XZ plane.

The fourth lower protrusion portion 123c may contact the third right inner spacer 162c and the third portion 180c of the gate 180. Moreover, the fourth lower protrusion portion 123c may be defined by the third right inner spacer 162c, the third portion 180c of the gate 180, and the second base portion 121c. The fourth lower protrusion portion 123c may be an inverted triangle in the cut-away view parallel to the XZ plane.

In some example embodiments of the inventive concepts, a direction in which the bottom end T2c of the third lower protrusion portion 122c is apart from (e.g., isolated from direct contact with) the top end T3b of the first upper protrusion portion 123b may be parallel to the vertical direction Z. In some example embodiments of the inventive concepts, a direction in which the bottom end T3c of the fourth lower protrusion portion 123c is apart from the top end T4b of the second upper protrusion portion 124b may be parallel to the vertical direction Z.

Referring to FIG. 1E, the second left inner spacer 161b (also referred to herein as a lower inner spacer) may include an inner surface 161bi (also referred to herein as a second inner surface) contacting the second portion 180b of the gate 180 and an outer surface 161bo (also referred to herein as a second outer surface) opposing the inner surface 161bi. The third left inner spacer 161c (also referred to herein as an upper inner spacer) may include an inner surface 161ci (also referred to herein as a first inner surface) contacting the third portion 180c of the gate 180 (e.g., contacting the gate 180) and an outer surface 161co (also referred to herein as a first outer surface) opposing the inner surface 161ci. The second right inner spacer 162b may include an inner surface 162bi contacting the second portion 180b of the gate 180 and an outer surface 162bo opposing the inner surface 162bi. The third right inner spacer 162c may include an inner surface 162ci contacting the third portion 180c of the gate 180 and an outer surface 162co opposing the inner surface 162ci.

A length L2 of the outer surface 161co of the third left inner spacer 161c in the vertical direction Z may be greater than a length L1 of the inner surface 161ci of the third left inner spacer 161c in the vertical direction Z. Likewise, a length of the outer surface 161bo of the second left inner spacer 161b in the vertical direction Z may be greater than a length of the inner surface 161bi of the second left inner spacer 161b in the vertical direction Z. Similarly, a length of the outer surface 162co of the third right inner spacer 162c in the vertical direction Z may be greater than a length of the inner surface 162ci of the third right inner spacer 162c in the vertical direction Z. Likewise, a length of the outer surface 162bo of the second right inner spacer 162b in the vertical direction Z may be greater than a length of the inner surface 162bi of the second right inner spacer 162b in the vertical direction Z.

In some example embodiments of the inventive concepts, a length L4 of the third portion 180c of the gate 180 in the first horizontal direction X may be less than a length L3 of the second portion 180b of the gate 180 in the first horizontal direction X. Restated, in a cross-sectional view where the semiconductor device 100 is cut away in parallel to the first horizontal direction X and the vertical direction Z, for example the cross-sectional view shown in at least FIGS. 1D-1E, the gate 180 may include a third portion 180c (also referred to herein as an upper portion of the gate 180 that is above the second channel 120b) and a second portion 180b (also referred to herein as a lower portion of the gate 180 that is under the second channel 120b), and a length L4 of the third portion 180c of the gate 180 in the first horizontal direction X may be less (e.g., smaller) than a length L3 of the second portion 180b of the gate 180 in the first horizontal direction.

In some example embodiments of the inventive concepts, in the cut-away view parallel to the XZ plane (e.g., in a cross-sectional view where the semiconductor device 100 is cut away in parallel to the first horizontal direction X and the vertical direction Z, for example the cross-sectional view shown in at least FIGS. 1D-1E), opposite side surfaces of the second portion 180b of the gate 180 may be dented inward. That is, the opposite side surfaces of the second portion 180b of the gate 180 may be concave. In other words, the inner surface 161bi of the second left inner spacer 161b and the inner surface 162bi of the second right inner spacer 162b may be convex. Likewise, the opposite side surfaces of the third portion 180c of the gate 180 may be dented inward. That is, the opposite side surfaces of the third portion 180c of the gate 180 may be concave. In other words, the inner surface 161ci of the third left inner spacer 161c and the inner surface 162ci of the third right inner spacer 162c may be convex.

In some example embodiments of the inventive concepts, the outer surface 161bo of the second left inner spacer 161b may be dented toward the inner surface 161bi of the second left inner spacer 161b. In some example embodiments of the inventive concepts, the outer surface 161co of the third left inner spacer 161c may be dented toward the inner surface 161ci of the third left inner spacer 161c. In some example embodiments of the inventive concepts, the outer surface 162*bo* of the second right inner spacer 162*b* may be dented toward the inner surface 162*bi* of the second right inner spacer 162*b*. In some example embodiments of the inventive concepts, the outer surface 162*co* of the third right inner spacer 162*c* may be dented toward the inner surface 162*ci* of the third right inner spacer 162*c*.

In some example embodiments of the inventive concepts, in a cross-sectional view parallel to the XZ plane (e.g., in a cross-sectional view where the semiconductor device 100 is cut away in parallel to the first horizontal direction X and the vertical direction Z, for example the cross-sectional view shown in at least FIGS. 1D-1E), a top surface 161*bu* of the second left inner spacer 161*b* (e.g., lower inner spacer) may have a shape descending in a direction close to the second portion 180*b* (e.g., lower portion) of the gate 180. A bottom surface 161*c*1 of the third left inner spacer 161*c* may have a shape ascending in a direction close to the third portion 180*c* of the gate 180. In some example embodiments of the inventive concepts, a part (e.g., a limited part) of a top surface 180*bu* of the second portion 180*b* of the gate 180 adjacent to the second left inner spacer 161*b* may have a shape descending in a direction close to the second left inner spacer 161*b*. A part of a bottom surface 180*c*1 of the third portion 180*c* of the gate 180 adjacent to the third left inner spacer 161*c* may have a shape ascending in a direction close to the third left inner spacer 161*c*.

Herein, the expression "have a shape ascending" may mean that "coordinates in the vertical direction Z increase", and the expression "have a shape descending" may mean that "coordinates in the vertical direction Z decrease". For example, the top surface 161*bu* may decrease in height (e.g., have decreasing coordinates in the vertical direction Z) with increasing proximity to the second portion 180*b*. Restated, a height (e.g., coordinates in the vertical direction Z) of a given portion of the top surface 161*bu* in the vertical direction Z may be inversely proportional to a proximity of the given portion of the top surface 161*bu* to the second portion 180*b*. In another example, bottom surface 161*c*1 may increase in height (e.g., have increasing coordinates in the vertical direction Z) with increasing proximity to the third portion 180*c*. Restated, a height (e.g., coordinates in the vertical direction Z) of a given portion of the bottom surface 161*c*1 in the vertical direction Z may be proportional to a proximity of the given portion of the bottom surface 161*c*1 to the third portion 180*c*. In another example, a part of the top surface 180*bu* may decrease in height (e.g., have decreasing coordinates in the vertical direction Z) with increasing proximity to the lower inner spacer (e.g., second left inner spacer 161*b*). Restated, a height (e.g., coordinates in the vertical direction Z) of a given portion of the top surface 180*bu* in the vertical direction Z may be inversely proportional to a proximity of the given portion of the top surface 180*bu* to the lower inner spacer (e.g., second left inner spacer 161*b*). In another example, a part of the bottom surface 180*c*1 may increase in height (e.g., have increasing coordinates in the vertical direction Z) with increasing proximity to the upper inner spacer (e.g., third left inner spacer 161*c*). Further restated, a height (e.g., coordinates in the vertical direction Z) of a given portion of the bottom surface 180*c*1 in the vertical direction Z may be proportional to a proximity of the given portion of the bottom surface 180*c*1 to the upper inner spacer (e.g., third left inner spacer 161*c*).

Likewise, in a cross-sectional view parallel to the XZ plane (e.g., in a cross-sectional view where the semiconductor device 100 is cut away in parallel to the first hori- zontal direction X and the vertical direction Z, for example the cross-sectional view shown in at least FIGS. 1D-1E), a top surface 162*bu* of the second right inner spacer 162*b* may have a shape descending in a direction close to the second portion 180*b* of the gate 180. A bottom surface 162*c*1 of the third right inner spacer 162*c* may have a shape ascending in a direction close to the third portion 180*c* of the gate 180. In some example embodiments of the inventive concepts, a part of a top surface 180*bu* of the second portion 180*b* of the gate 180 adjacent to the second right inner spacer 162*b* may have a shape descending in a direction close to the second right inner spacer 162*b*. A part of a bottom surface 180*c*1 of the third portion 180*c* of the gate 180 adjacent to the third right inner spacer 162*c* may have a shape ascending in a direction close to the third right inner spacer 162*c*.

In some example embodiments of the inventive concepts, in a cross-sectional view parallel to the XZ plane (e.g., in a cross-sectional view where the semiconductor device 100 is cut away in parallel to the first horizontal direction X and the vertical direction Z, for example the cross-sectional view shown in at least FIGS. 1D-1E), a boundary B1 between the second channel 120*b* and the first source/drain SD1 may extend between the bottom surface 161*c*1 of the third left inner spacer 161*c* (e.g., a bottom surface of the upper inner spacer) and the top surface 161*bu* of the second left inner spacer 161*b* (e.g., a top surface of the lower inner spacer). In some example embodiments of the inventive concepts, a boundary B2 between the second channel 120*b* and the second source/drain SD2 may extend between the bottom surface 162*c*1 of the third right inner spacer 162*c* and the top surface 162*bu* of the second right inner spacer 162*b*. Thus, on the plane view, i.e., an XY plane, the left inner spacers 161*c* and 161*b* may overlap the first source/drain SD1 and the right inner spacers 162*c* and 162*b* may overlap the second source/drain SD2.

Referring to FIG. 1F, a distance D1 between the top end T3*b* of the first upper protrusion portion and the top end T4*b* of the second upper protrusion portion in the first horizontal direction X may be less than a distance D2 between the bottom end T2*b* of the first lower protrusion portion and the bottom end T5*b* of the second lower protrusion portion in the first horizontal direction X. As shown in at least FIGS. 1D-1F, the top end T3*b* of the first upper protrusion portion may be between the third left inner spacer 161*c* (e.g., first upper inner spacer) and the gate 180 in at least the first horizontal direction X, and the top end T4*b* of the second upper protrusion portion may be between the third right inner spacer 162*c* (e.g., second upper inner spacer) and the gate 180 in at least the first horizontal direction X. As shown in at least FIGS. 1D-1F, the bottom end T2*b* of the first lower protrusion portion may be between the second left inner spacer 161*b* (e.g., first lower inner spacer) and the gate 180 in at least the first horizontal direction X, and the bottom end T5*b* of the second lower protrusion portion may be between the second right inner spacer 162*b* (e.g., second lower inner spacer) and the gate 180 in at least the first horizontal direction X.

In some example embodiments of the inventive concepts, a length L6 of the third channel 120*c* (e.g., upper channel) in the first horizontal direction X may be less than a length L5 of the second channel 120*b* (e.g., lower channel) in the first horizontal direction X.

In some example embodiments of the inventive concepts, the length L5 of the second channel 120*b* in the first horizontal direction X may be less than a length D4 between the outer surface 161*bo* of the second left inner spacer 161*b* and the outer surface 162*bo* of the second right inner spacer 162b in the first horizontal direction X. In some example embodiments of the inventive concepts, the length L5 of the second channel 120b in the first horizontal direction X may be greater than a length D3 between the inner surface 161bi of the second left inner spacer 161b and the inner surface 162bi of the second right inner spacer 162b. Thus, on the plane view, i.e., the XY plane, the left inner spacers 161c and 161b may overlap the first source/drain SD1 and the right inner spacers 162c and 162b may overlap the second source/drain SD2.

Figure 2A:
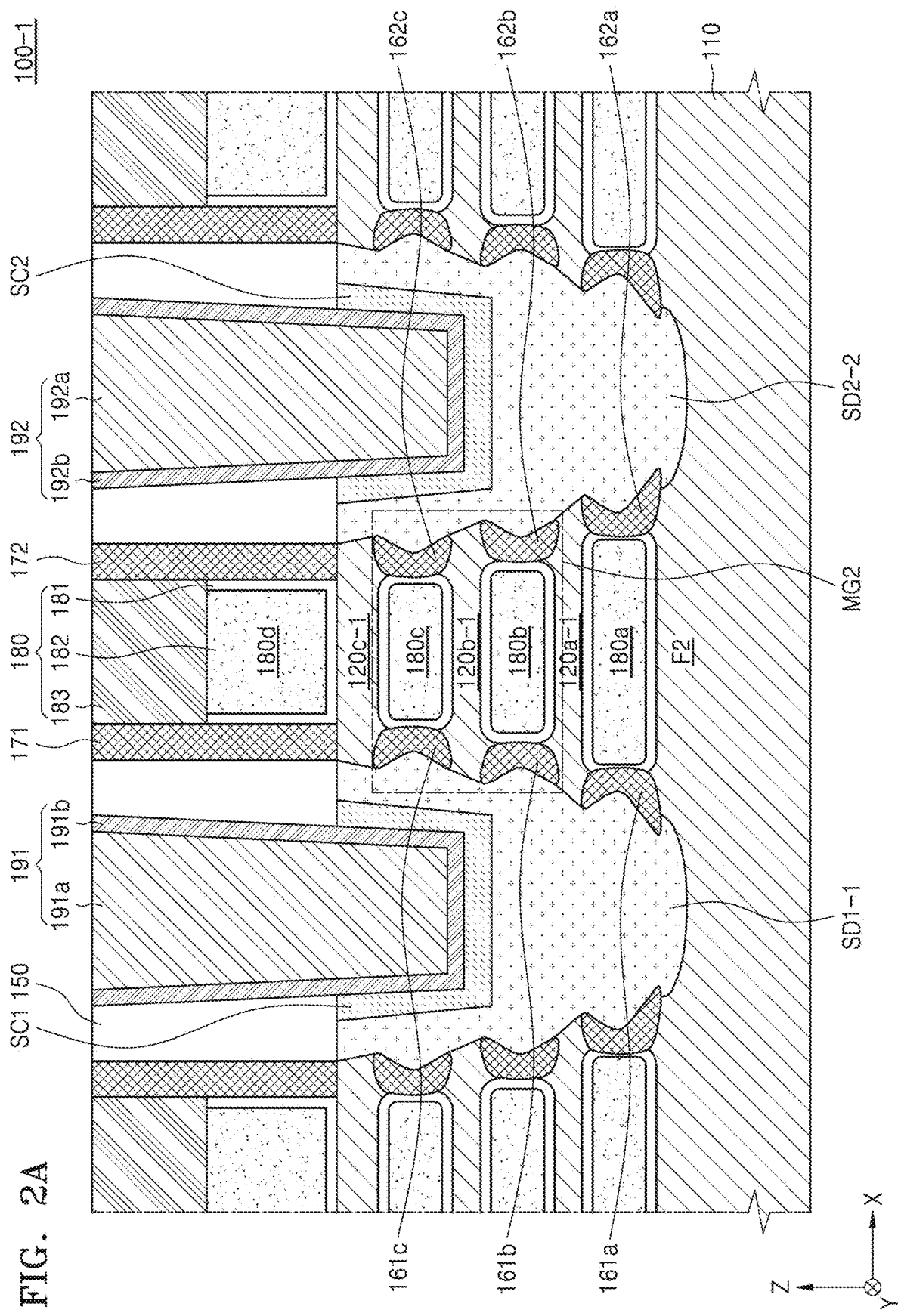
FIG. 2A is a cross-sectional view of a semiconductor device according to some example embodiments of the inventive concepts.
Figure 2B:
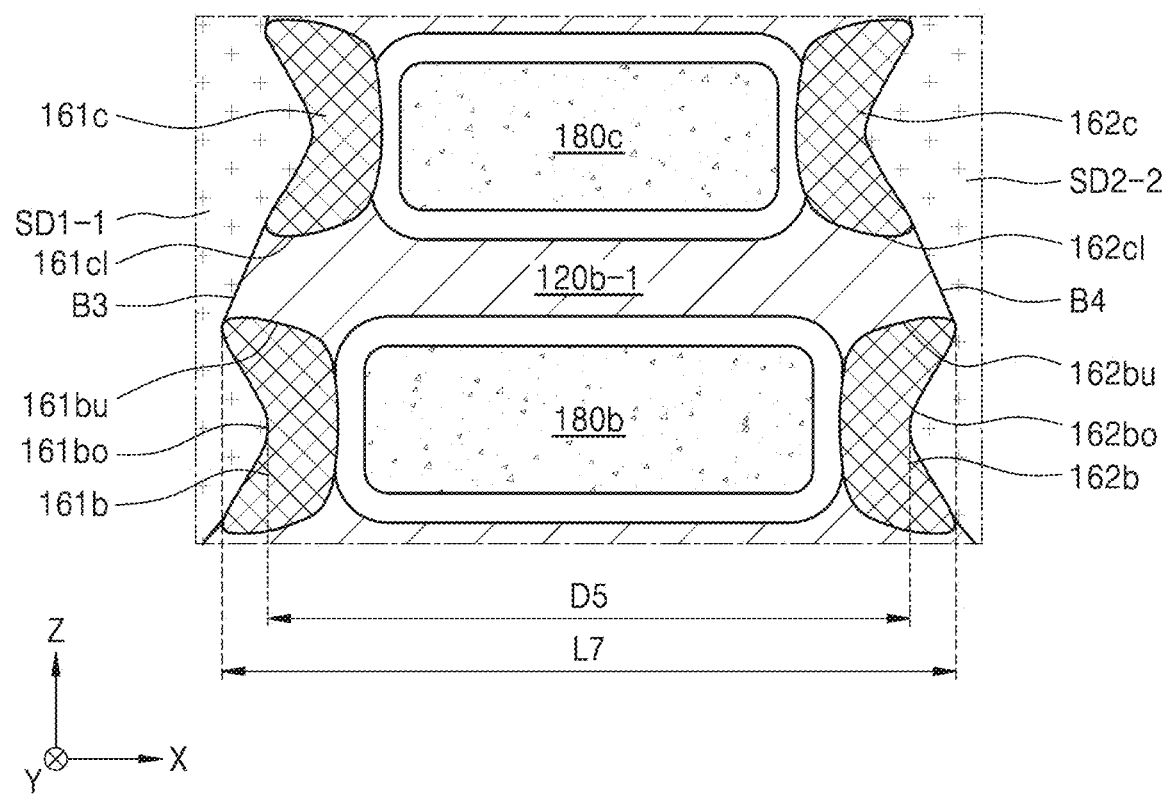
FIG. 2B is an enlarged view of a region MG2 of FIG. 2A.

FIG. 2A is a cross-sectional view of a semiconductor device 100-1 according to some example embodiments of the inventive concepts. FIG. 2B is an enlarged view of a region MG2 of FIG. 2A. Hereinbelow, a difference between the semiconductor device 100 described with reference to FIGS. 1A through 1F and the semiconductor device 100-1 shown in FIGS. 2A and 2B will be described.

Referring to FIGS. 2A and 2B, the semiconductor device 100-1 may include a first source/drain SD1-1, a second source/drain SD2-2, and a plurality of first through third channels 120a-1 through 120c-1, instead of the first source/drain SD1, the second source/drain SD2, and the plurality of channels 120a through 120c shown in FIGS. 1A through 1F.

As shown in FIG. 2B, a part of the first source/drain SD1-1 contacting the second channel 120b-1 may not protrude between the second left inner spacer 161b and the third left inner spacer 161c. A part of the second source/drain SD2-1 contacting the second channel 120b-1 may not protrude between the second right inner spacer 162b and the third right inner spacer 162c.

In some example embodiments of the inventive concepts, a boundary B3 between the second channel 120b-1 and the first source/drain SD1-1 may not extend between the bottom surface 161c1 of the third left inner spacer 161c and the top surface 161bu of the second left inner spacer 161b. A boundary B4 between the second channel 120b-1 and the second source/drain SD2-1 may not extend between the bottom surface 162c1 of the third right inner spacer 162c and the top surface 162bu of the second right inner spacer 162b.

In some example embodiments of the inventive concepts, the length L7 of the second channel 120b-1 in the first horizontal direction X may be greater than a length D5 between the outer surface 161bo of the second left inner spacer 161b and the outer surface 162bo of the second right inner spacer 162b in the first horizontal direction X.

Figure 3A:
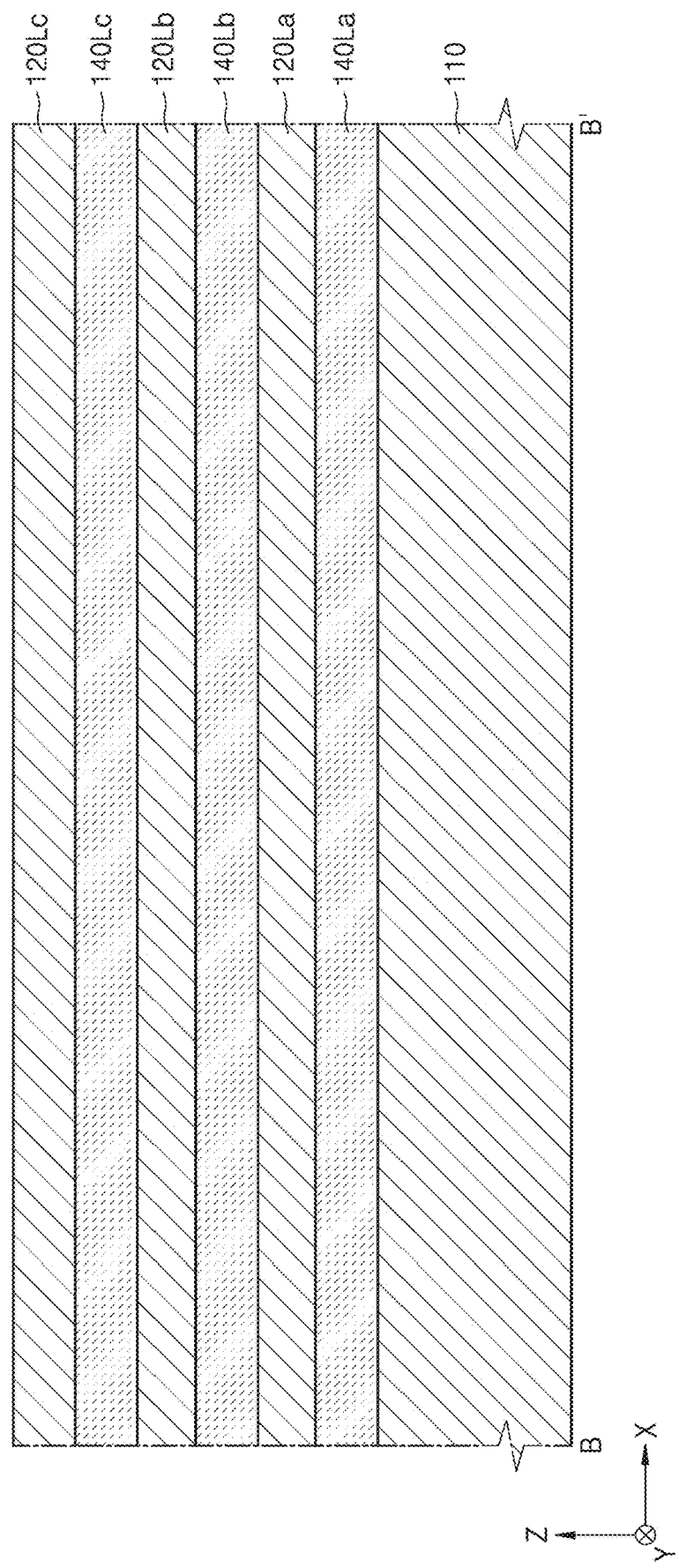
FIGS. 3A, 3B, 3C, 3D, 3E, 3F, 3G, 3H, 3I, 3J, and 3K are cross-sectional views for describing a method of manufacturing a semiconductor device according to some example embodiments of the inventive concepts.
Figure 3B:
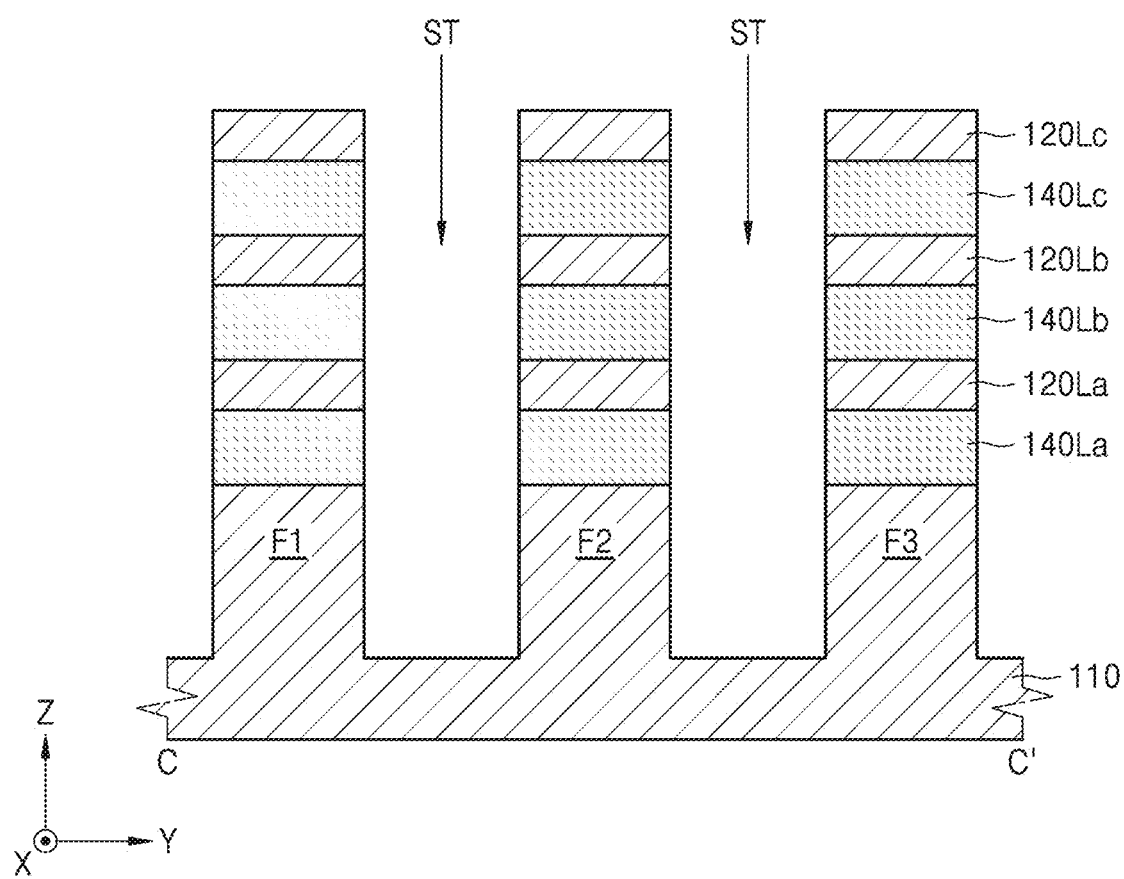
Figure 3C:
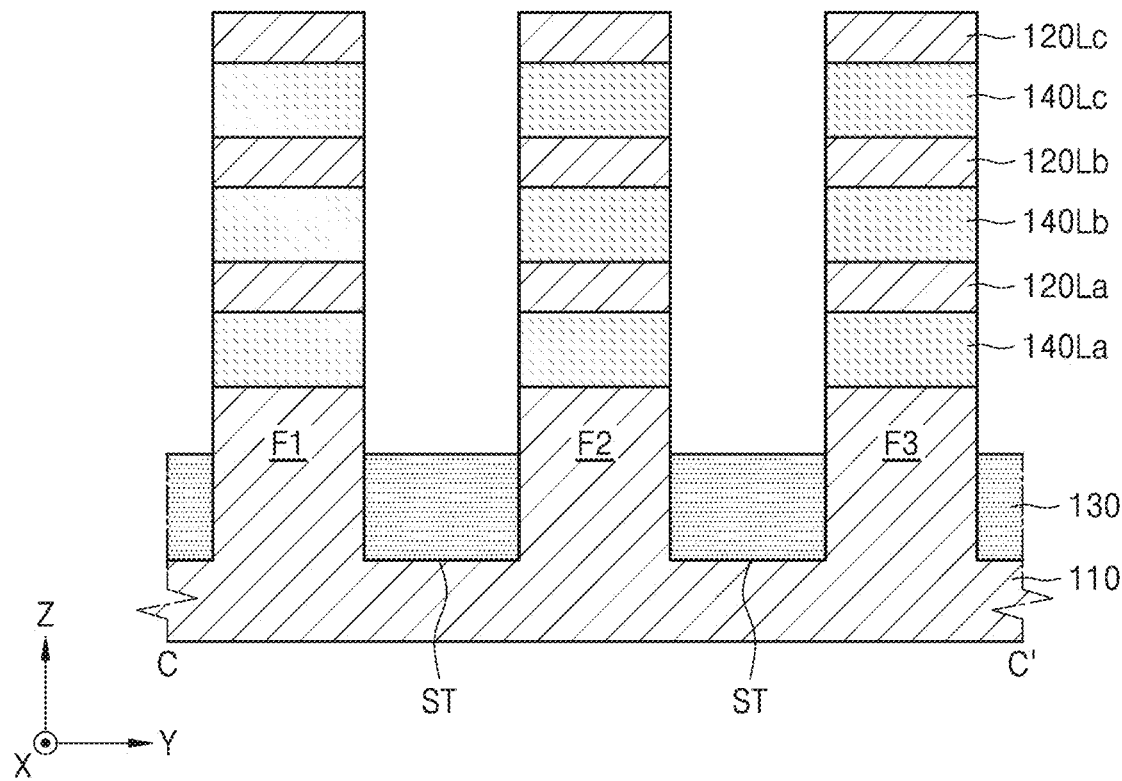

FIGS. 3A, 3B, 3C, 3D, 3E, 3F, 3G, 3H, 3I, 3J, and 3K are cross-sectional views for describing a method of manufacturing a semiconductor device according to some example embodiments of the inventive concepts. FIGS. 3A and 3D through 3K each may correspond to cross-sectional views taken along the line B-B' of FIG. 1A. FIGS. 3B and 3C each may correspond to cross-sectional views taken along the line C-C' of FIG. 1A.

Referring to FIG. 3A, a plurality of sacrificial layers 140La through 140Lc and a plurality of channel layers 120La through 120Lc may be formed alternately on the substrate 110. In FIG. 3A, the three sacrificial layers 140La through 140Lc and the three channel layers 120La through 120Lc are stacked, but each of the number of sacrificial layers and the number of channel layers is not limited to 3.

The plurality of sacrificial layers 140La through 140Lc and the plurality of channel layers 120La through 120Lc may include different semiconductor materials having etching selectivities. For example, the plurality of channel layers 120La through 120Lc may include silicon (Si), and the plurality of sacrificial layers 140La through 140Lc may include silicon germanium (SiGe). A content of Ge in the plurality of sacrificial layers 140La through 140Lc may range, for example, from about 5 atom % to about 60 atom %, e.g., about 10 atom % to about 40 atom %.

Referring to FIG. 3B, by etching the plurality of channel layers 120La through 120Lc, the plurality of sacrificial layers 140La through 140Lc, and the substrate 110, a plurality of isolation trenches ST may be formed. The plurality of isolation trenches ST may define the plurality of fin-type active regions F1 through F3 protruding from the substrate 110 in the vertical direction Z. A stack structure of the plurality of sacrificial layers 140La through 140Lc and the plurality of channel layers 120La through 120Lc may remain on the plurality of fin-type active regions F1 through F3.

Referring to FIG. 3C, the isolating insulation layer 130 may be formed on the substrate 110, the plurality of channel layers 120La through 120Lc, and the plurality of sacrificial layers 140La through 140Lc to fill the plurality of isolation trenches ST. The isolating insulation layer 130 may be etched to expose an upper portion of each of the fin-type active regions F1 through F3. For example, the isolating insulation layer 130 may be formed to form a first insulation liner (not shown), a second insulation liner (not shown), and a buried insulation layer (not shown).

Figure 3D:
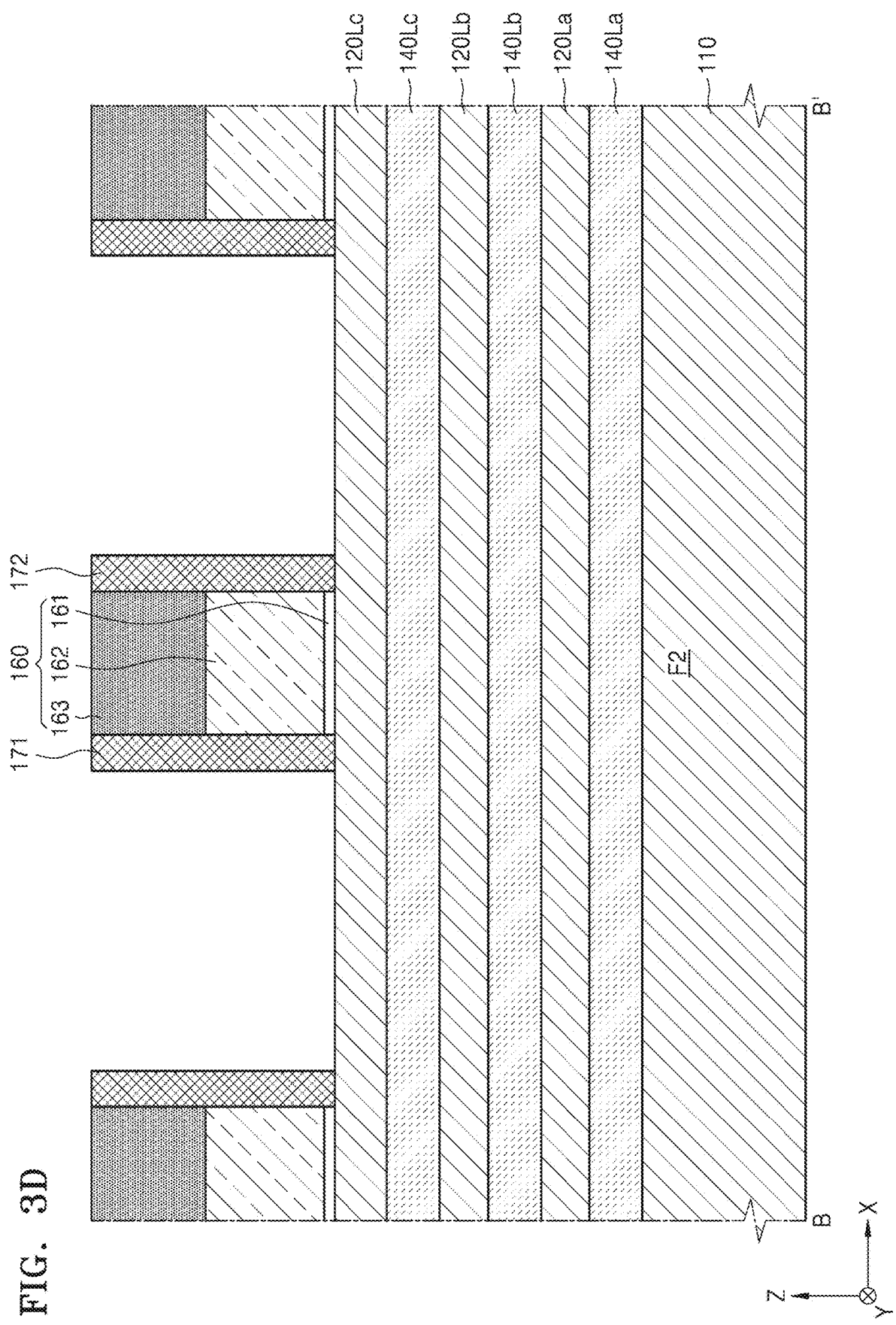

Referring to FIG. 3D, a plurality of dummy gates 160 may be formed on a stack structure of the plurality of sacrificial layers 140La through 140Lc and the plurality of channel layers 120La through 120Lc. Each dummy gate 160 may extend in the second horizontal direction Y and intersect with the stack structure of the plurality of sacrificial layers 140La through 140Lc and the plurality of channel layers 120La through 120Lc.

The dummy gate 160 may include a dummy insulation pattern 161 on the stack structure of the plurality of sacrificial layers 140La through 140Lc and the plurality of channel layers 120La through 120Lc, a dummy gate pattern 162 on the dummy insulation pattern 161, and a dummy capping pattern 163 on the dummy gate pattern 162. Each of the dummy insulation pattern 161, the dummy gate pattern 162, and the dummy capping pattern 163 may extend in the second horizontal direction Y. The dummy insulation pattern 161 may include, e.g., a silicon oxide, a silicon nitride, or a combination thereof. The dummy gate pattern 162 may include, for example, polysilicon. The dummy capping pattern 163 may include, for example, a silicon nitride.

On opposite side surfaces of the dummy gate 160, the first spacer 171 and the second spacer 172 may be formed, respectively. For example, a spacer layer (not shown) may be formed on the dummy gate 160 and the stack structure of the plurality of channel layers 120La through 120Lc and the plurality of sacrificial layers 140La through 140Lc, and the spacer layer may be anisotropically etched, such that the first spacer 171 and the second spacer 172 may be formed. Each of the first spacer 171 and the second spacer 172 may include a silicon oxide, a silicon nitride, or a combination thereof.

Figure 3E:
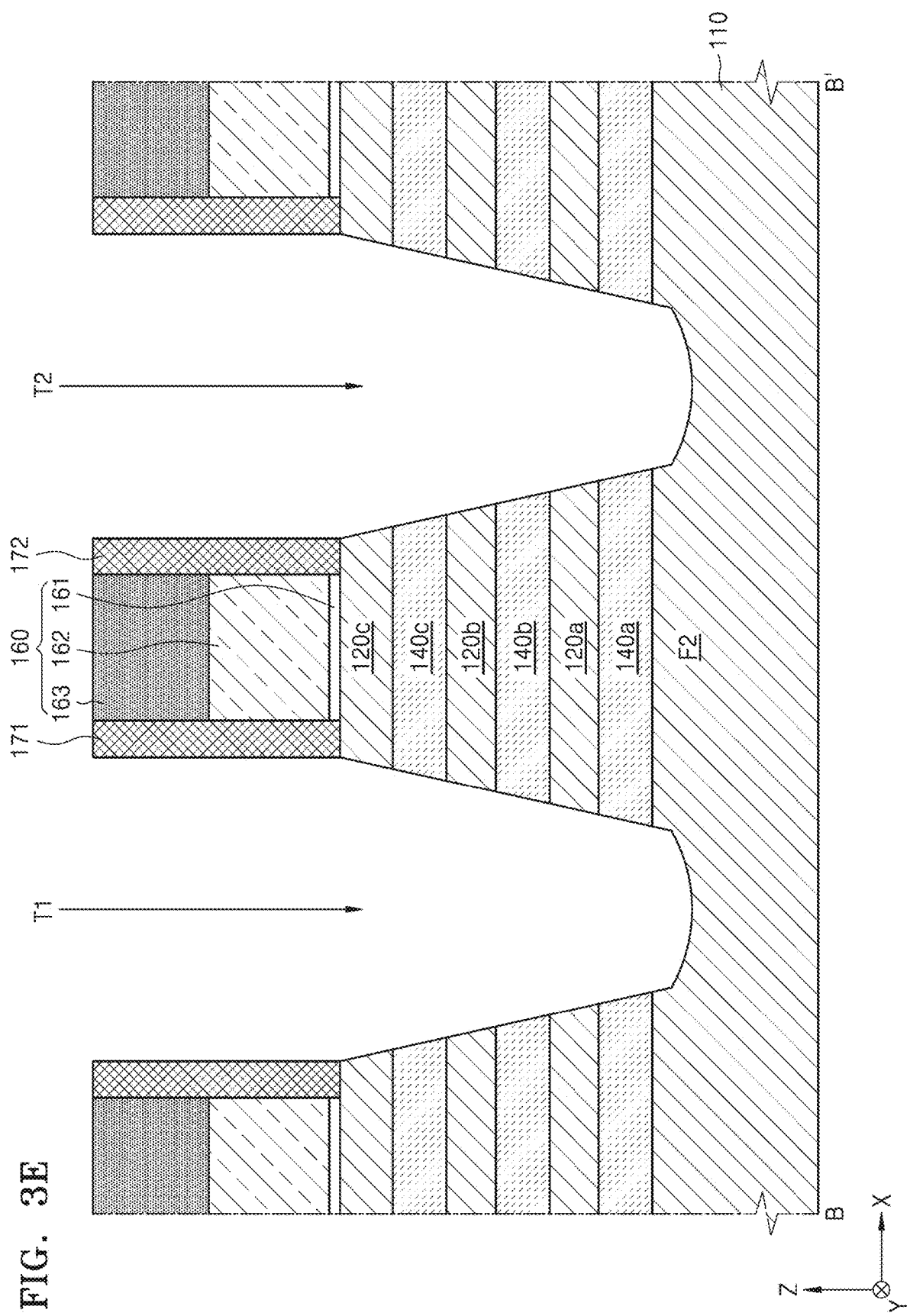

Referring to FIGS. 3D and 3E, a first trench T1 and a second trench T2 may be formed by etching the stack structure of the plurality of channel layers 120La through 120Lc and the plurality of sacrificial layers 140La through 140Lc using the dummy gate 160, the first spacer 171, and the second spacer 172 as an etch mask.

The first trench T1 and the second trench T2 may separate the plurality of channel layers 120La through 120Lc into the plurality of channels 120a through 120c. The first trench T1 and the second trench T2 may separate the plurality of sacrificial layers 140La through 140Lc into the plurality of sacrificial patterns 140a through 140c. The first trench T1 and the second trench T2 may expose end portions of the plurality of sacrificial patterns 140a through 140c and the plurality of channels 120a through 120c.

To form the first trench T1 and the second trench T2, etching of high anisotropy may be used. When etching of high anisotropy is used, a deviation in lengths of the channels 120a through 120c in the first horizontal direction X may be reduced.

Figure 3F:
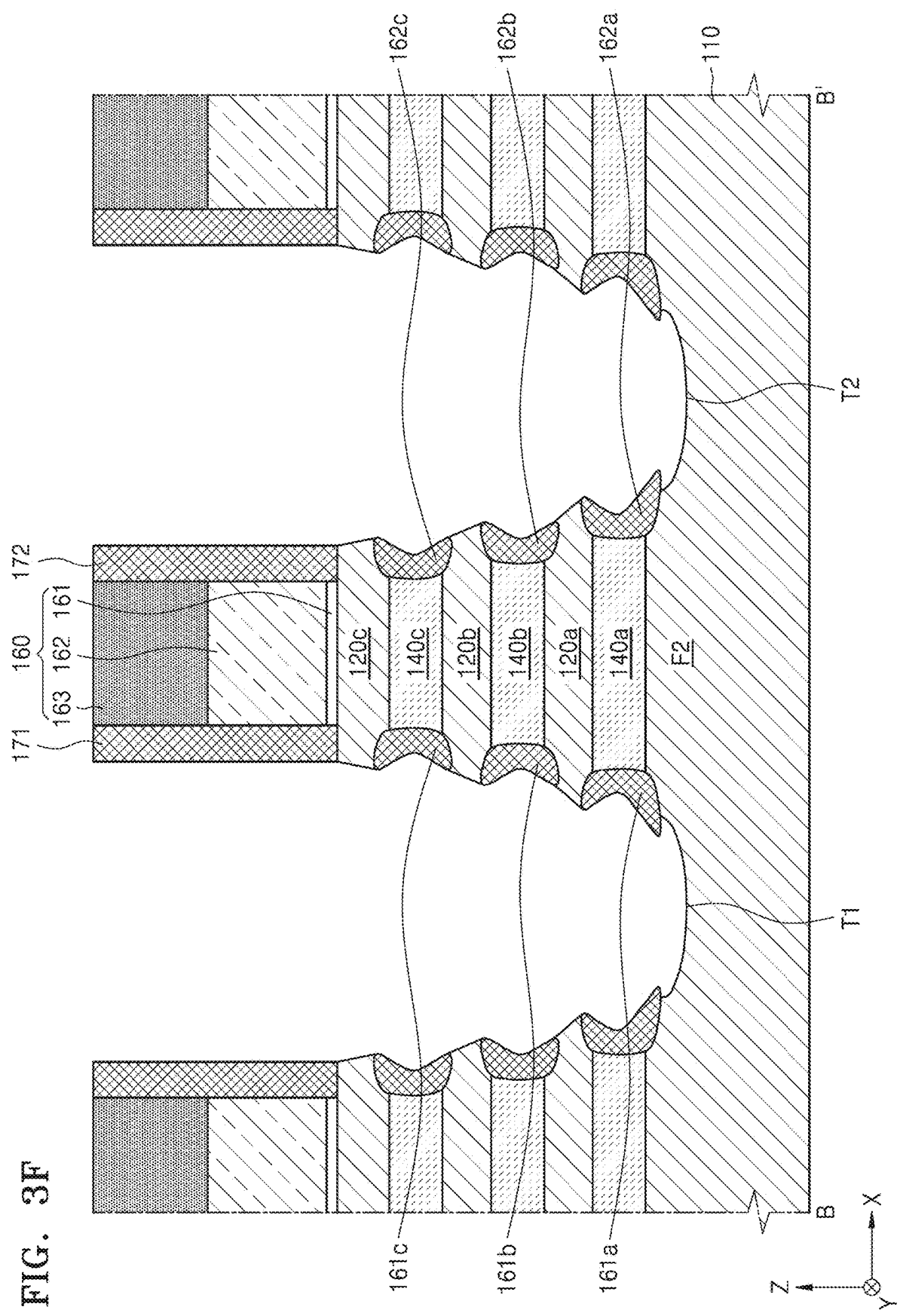

Referring to FIG. 3F, an end portion of each of the sacrificial patterns 140a through 140c may be etched. To etch the end portion of each of the sacrificial patterns 140a through 140c, etching of high anisotropy may be used. During etching of the end portion of each of the sacrificial patterns 140a through 140c, the plurality of channels 120a through 120c may be partially etched. For example, upper and lower parts of the end portion of the first channel 120a may be etched to reduce the thickness of the end portion of the first channel 120a in the vertical direction Z. Upper and lower parts of the end portion of the second channel 120b may be etched such that the thickness of the end portion of the second channel 120b in the vertical direction Z may be reduced. A lower part of the end portion of the third channel 120c may be etched such that the thickness of the third channel 120c in the vertical direction Z may be reduced.

Each of the left inner spacers 161a through 161c and the right inner spacers 162a through 162c may be formed in a space where an end portion of each of the sacrificial patterns 140a through 140c is located. That is, the first left inner spacer 161a may be formed in a space defined by a top surface of the second fin-type active region F2, a left side surface of the first sacrificial pattern 140a, and a bottom surface of the first channel 120a. The first right inner spacer 162a may be formed on a space defined by the top surface of the second fin-type active region F2, a right side surface of the first sacrificial pattern 140a, and the bottom surface of the first channel 120a. The second left inner spacer 161b may be formed in a space defined by a top surface of the first channel 120a, a left side surface of the second sacrificial pattern 140b, and a bottom surface of the second channel 120b. The second right inner spacer 162b may be formed in a space defined by the top surface of the first channel 120a, a right side surface of the second sacrificial pattern 140b, and the bottom surface of the second channel 120b. The third left inner spacer 161c may be formed in a space defined by a top surface of the second channel 120b, a left side surface of the third sacrificial pattern 140c, and a bottom surface of the third channel 120c. The third right inner spacer 162c may be formed in a space defined by the top surface of the second channel 120b, a right side surface of the third sacrificial pattern 140c, and the bottom surface of the third channel 120c.

An inner spacer layer (not shown) may be formed on the stack structure of the plurality of channels 120a through 120c and the plurality of sacrificial patterns 140a through 140c, the first spacer 171, the second spacer 172, and the dummy gate 160, through the first trench T1 and the second trench T2, and the inner spacer layer may be etched, such that the plurality of left inner spacers 161a through 161c and the plurality of right inner spacers 162a through 162c may be formed. For etching of the spacer layer, wet etching of low anisotropy may be used.

Figure 3G:
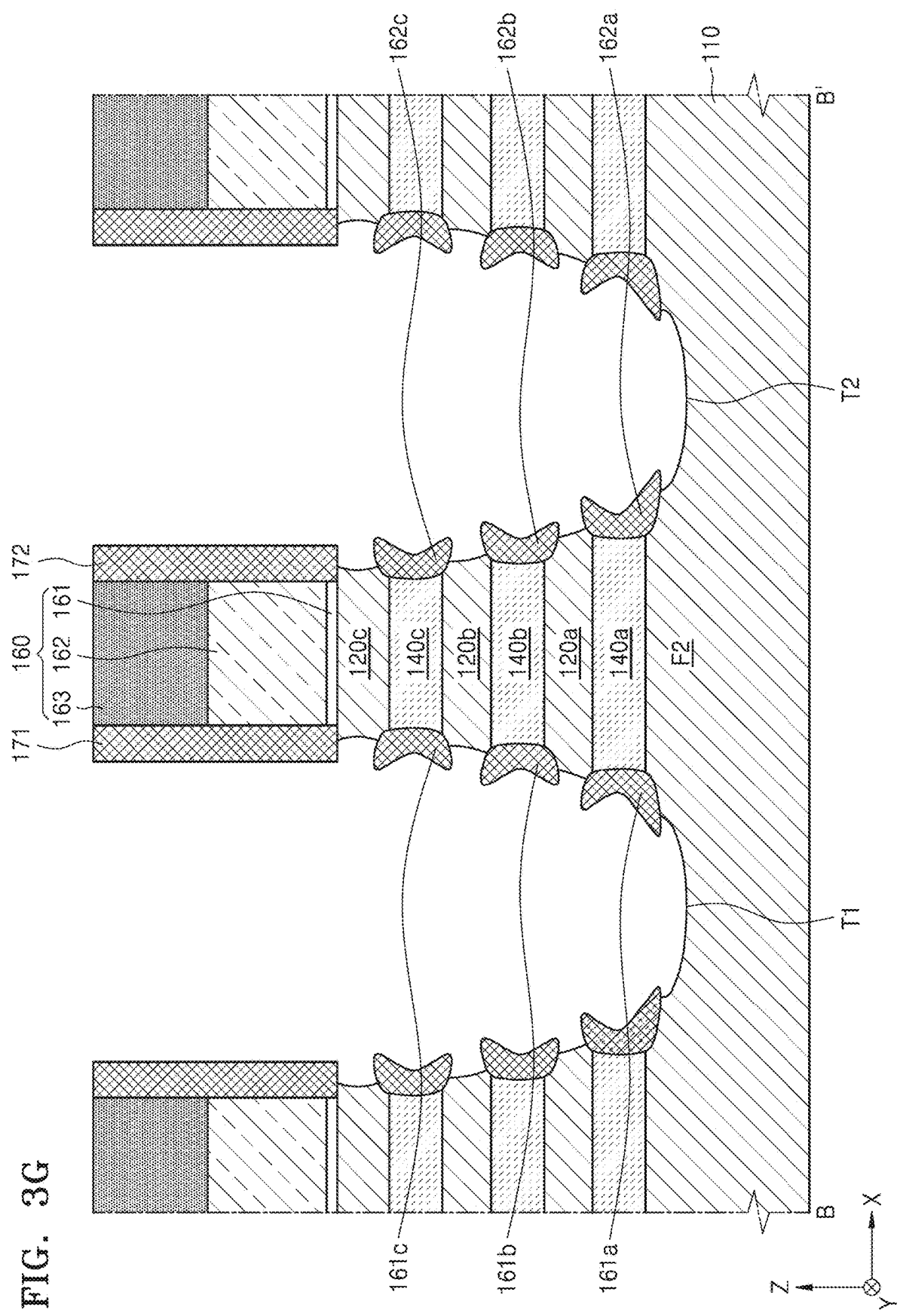

Referring to FIG. 3G, opposite end portions of each of the channels 120a through 120c may be etched. Thus, a length of each of the channels 120a through 120c in the first horizontal direction X may be reduced. As a result, empty spaces may be formed between the first left inner spacer 161a and the second left inner spacer 161b, between the second left inner spacer 161b and the third left inner spacer 161c, between the third left inner spacer 161c and the first spacer 171, between the first right inner spacer 162a and the second right inner spacer 162b, between the second right inner spacer 162b and the third right inner spacer 162c, and between the third right inner spacer 162c and the second spacer 172. To etch each of the channels 120a through 120c, etching of low anisotropy may be used.

Figure 3H:
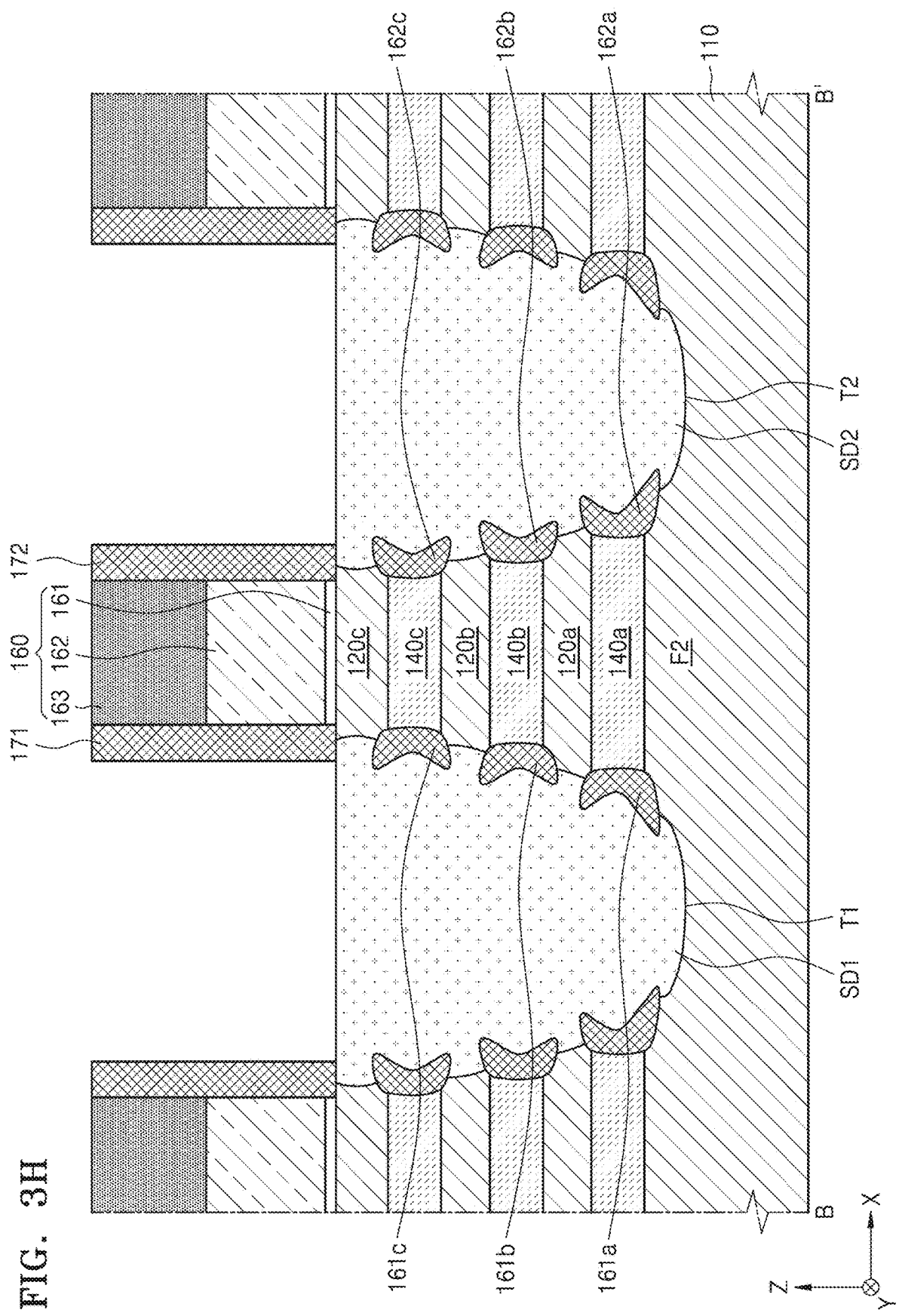

Referring to FIG. 3H, the first source/drain SD1 in the first trench T1 and the second source/drain SD2 in the second trench T2 may be formed. To form the first source/drain SD1 and the second source/drain SD2, a semiconductor material may epitaxially grow from a surface of the second fin-type active region F2 exposed through bottoms of the first trench T1 and the second trench T2 and opposite side surfaces of each of the channels 120a through 120c. In embodiments of the inventive concepts, to form the first source/drain SD1 and the second source/drain SD2, low-pressure chemical vapor deposition (LPCVD) processing, selective epitaxial growth processing, or cyclic deposition and etching (CDE) processing may be performed. In some example embodiments of the inventive concepts, each of the first source/drain SD1 and the second source/drain SD2 may include a silicon layer doped with an n-type dopant. As a silicon source, e.g., silane ($SiH_4$), disilane ($Si_2H_6$), trisilane ($Si_3H_8$), dichlorosilane ($SiH_2Cl_2$), or a combination thereof may be used. The n-type dopant may include, for example, phosphorus (P), arsenic (As), antimony (Sb), or a combination thereof.

Figure 3I:
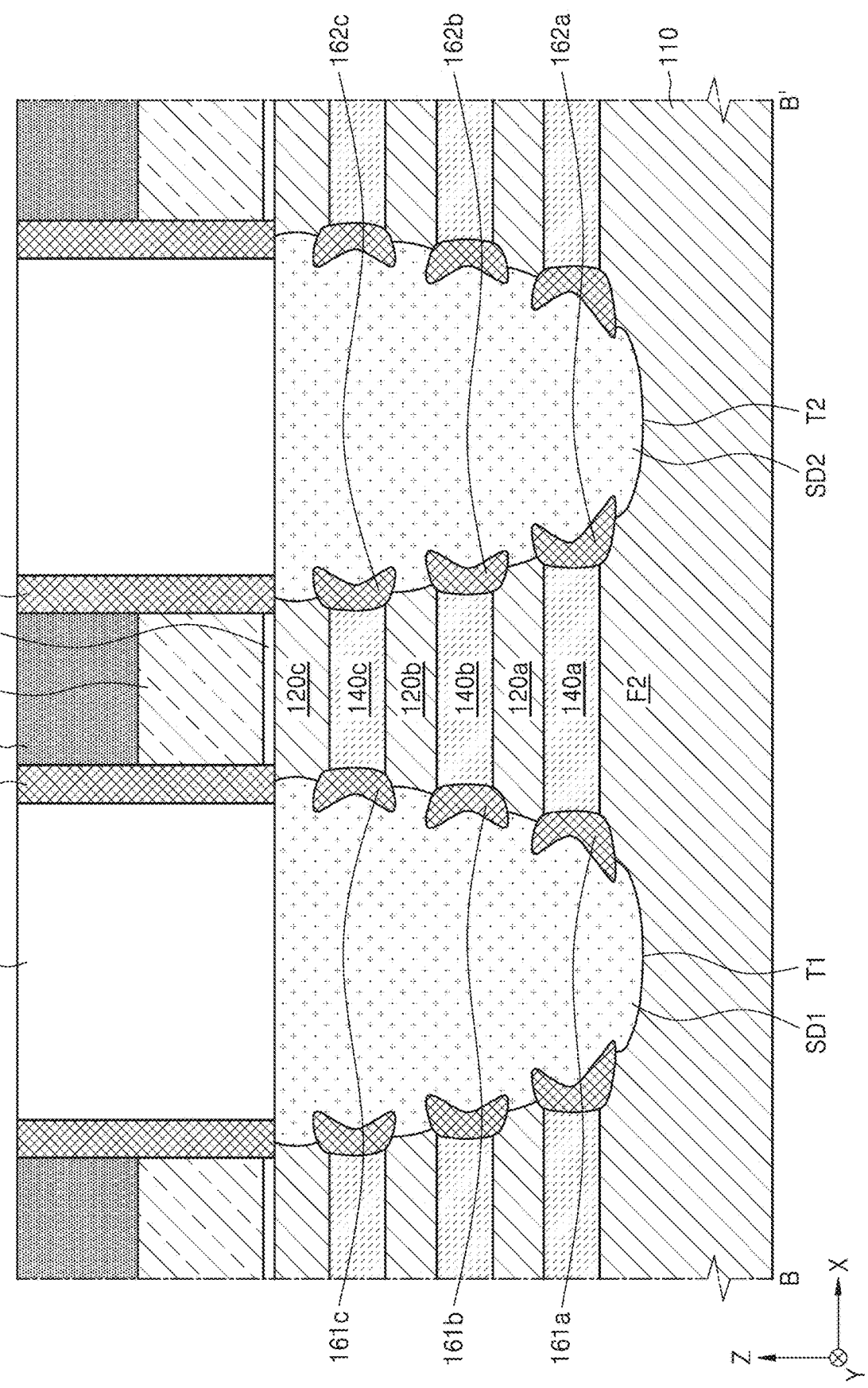

Referring to FIG. 3I, the inter-gate insulation layer 150 that covers the first source/drain SD1 and the second source/drain SD2 and fills a space between spacers on side surfaces of the adjacent dummy gates 160. The inter-gate insulation layer 150 may be formed on the first source/drain SD1, the second source/drain SD2, the first spacer 171, the second spacer 172, and the dummy gate 160. Thereafter, an upper portion of the inter-gate insulation layer 150 may be removed to expose the first spacer 171, the second spacer 172, and the dummy gate 160.

Figure 3J:
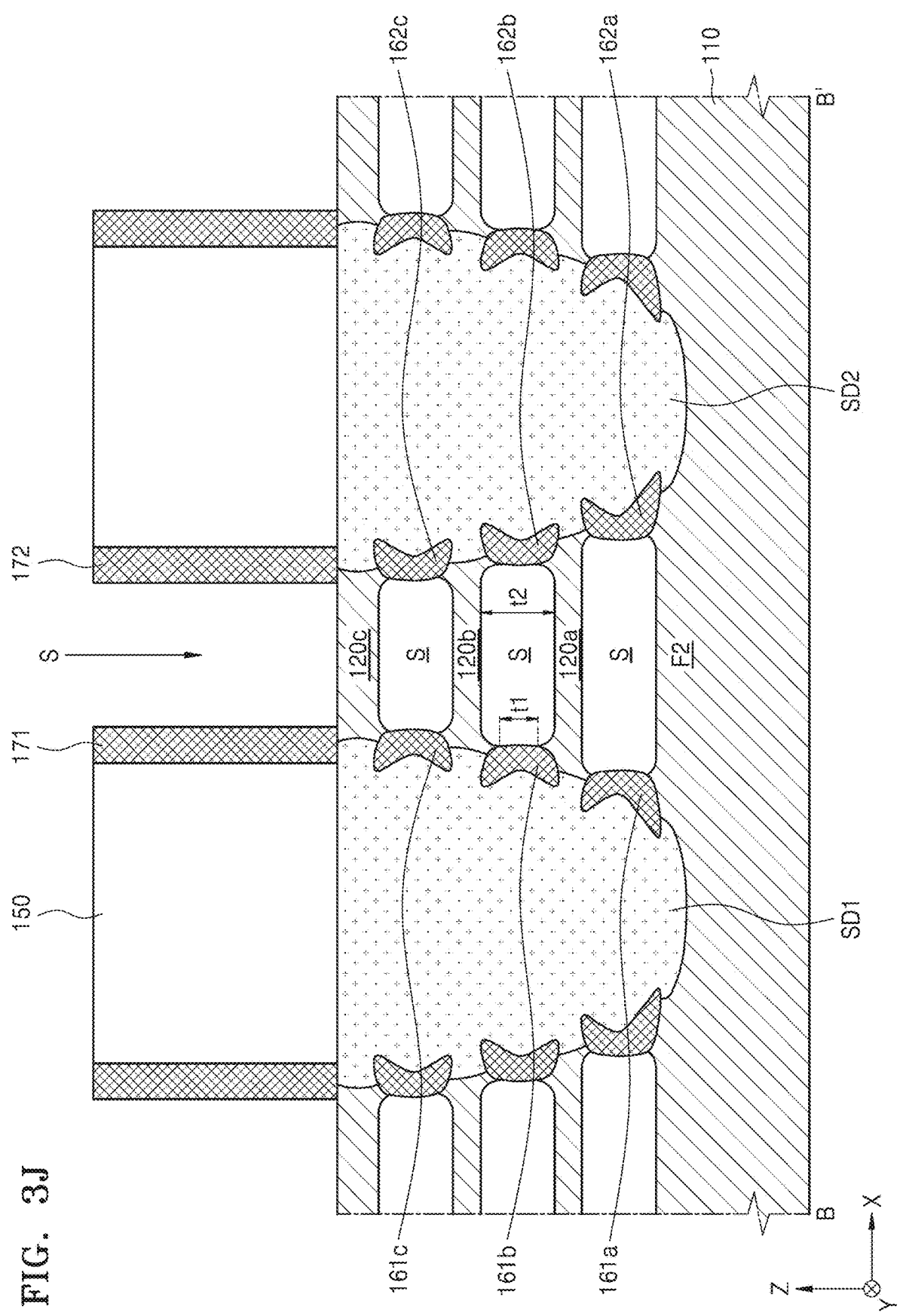

Referring to FIGS. 3I and 3J, the dummy gate 160 may be removed. The plurality of sacrificial patterns 140a through 140c may be removed. As a result, an empty space S may be formed between the second fin-type active region F2 and the first channel 120a, between the first channel 120a and the second channel 120b, between the second channel 120b and the third channel 120c, and between the first spacer 171 and the second spacer 172.

In embodiments of the inventive concepts, wet etching may be used to selectively remove the plurality of sacrificial patterns 140a through 140c. For example, to selectively remove the plurality of sacrificial patterns 140a through 140c, a $CH_3COOH$-based etchant, e.g., an etchant including a mixture of $CH_3COOH$, $HNO_3$, and HF, or an etchant including a mixture of $CH_3COOH$, $H_2O_2$, and HF, may be used.

During removal of the plurality of sacrificial patterns 140a through 140c, a part of the plurality of channels 120a through 120c and a part of the second fin-type active region F2 may be removed. Due to characteristics of wet etching, the opposite end portions of each of the channels 120a through 120c may be relatively less etched and a central portion of each of the channels 120a through 120c may be relatively more etched. Thus, each empty space S between the second fin-type active region F2 and the first channel 120a, between the first channel 120a and the second channel 120b, or between the second channel 120b and the third channel 120c may have a shape in which a thickness t2 of a central portion of the empty space S in the vertical direction Z is greater than a thickness t1 of an end portion of the empty space S in the vertical direction Z.

Figure 3K:
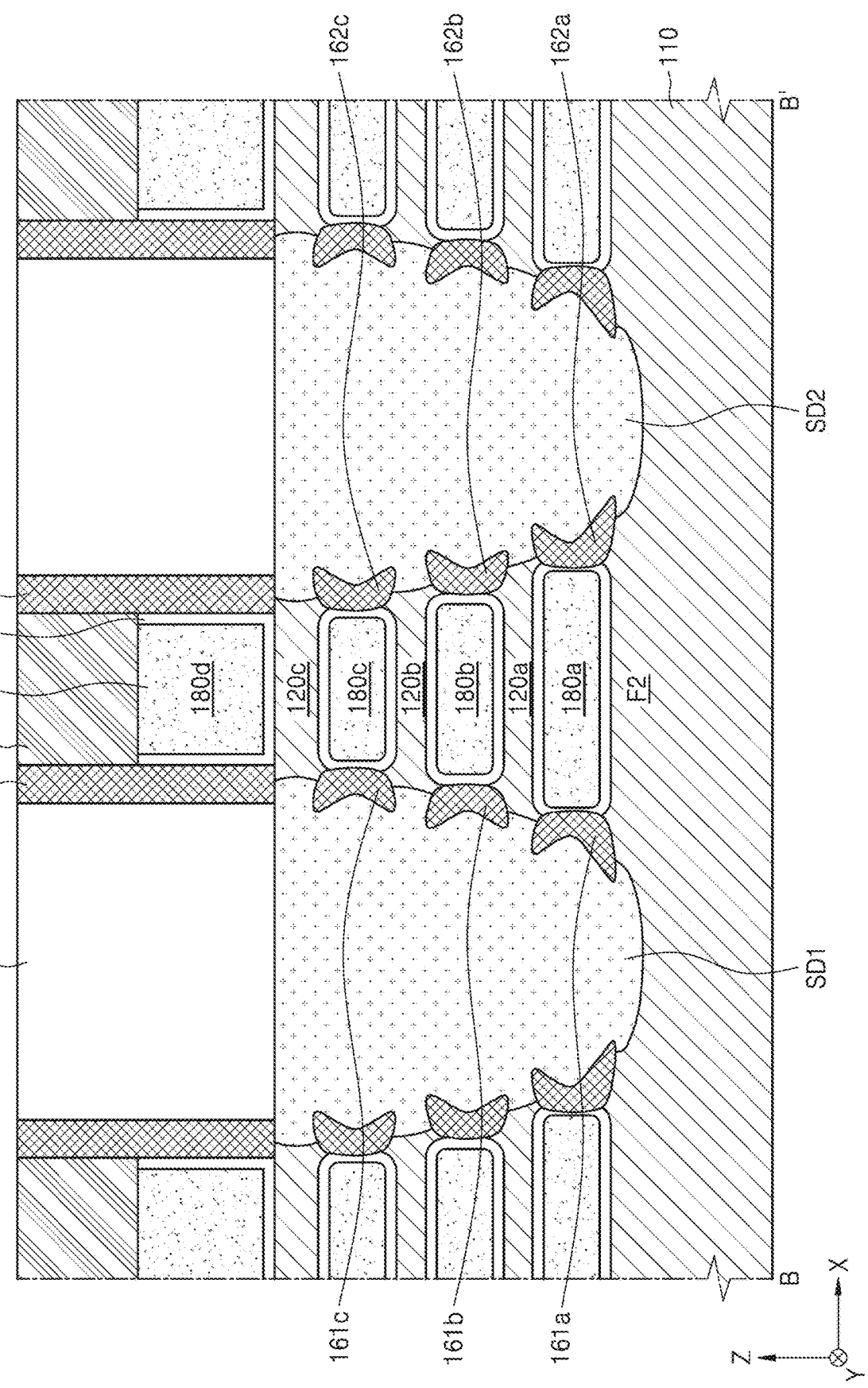

Referring to FIGS. 3J and 3K, the gate insulation layer 181 may be formed in the empty space S. The gate insulation layer 181 may be formed on an inner surface of the first spacer 171, an inner surface of the second spacer 172, inner surfaces of the plurality of left inner spacers 161a through 161c, inner surfaces of the plurality of right inner spacers 162a through 162c, a bottom surface and a top surface of each of the channels 120a through 120c, and a top surface of the fin-type active region F2.

Next, to fill the empty space S, the gate electrode 182 may be formed on the gate insulation layer 181. After upper portions of the gate insulation layer 181 and the gate electrode 182 are removed, the gate capping layer 183 may be formed in a space in which the gate insulation layer 181 and the gate electrode 182 are removed. Thus, the gate 180 may be completed.

Referring to FIG. 1B, a first contact hole (not shown) that passes through the inter-gate insulation layer 150 in the vertical direction Z to expose the first source/drain SD1 and a second contact hole that passes through the inter-gate insulation layer 150 in the vertical direction Z to expose the second source/drain SD2 may be formed. A first metal silicide layer SC1 contacting the first source/drain SD1 under the first contact hole, a second metal silicide layer SC2 contacting the second source/drain SD2 under the second contact hole, a first contact 191 filling the first contact hole, and a second contact 192 filling the second contact hole may be formed. The first contact 191 may be formed by forming the first barrier layer 191b on the first contact hole and forming the first metal layer 191a on the first barrier layer 191b. The second contact 192 may be formed by forming the second barrier layer 192b on the second contact hole and forming the second metal layer 192a on the second barrier layer 192b.

According to the manufacturing method described with reference to FIGS. 3A through 3K and 1B, the semiconductor device 100 described with reference to FIGS. 1A through 1F may be manufactured. When an operation of etching the end portion of each of the channels 120a through 120c described with reference to FIGS. 3F and 3G is omitted in the above-described manufacturing method, the semiconductor device 100-1 described with reference to FIGS. 2A and 2B may be manufactured.

While the inventive concepts have been particularly shown and described with reference to some example embodiments thereof, it will be understood that various changes in form and details may be made therein without departing from the spirit and scope of the following claims.

What is claimed is:

1. A semiconductor device, comprising:
a first source/drain;
a second source/drain isolated from direct contact with the first source/drain in a horizontal direction;
a channel extending between the first source/drain and the second source/drain;
a gate surrounding the channel;
an upper inner spacer between the gate and the first source/drain and above the channel; and
a lower inner spacer between the gate and the first source/drain and under the channel,
wherein the channel includes
a base portion extending between the first source/drain and the second source/drain such that opposite side surfaces of the base portion are directly contacting the first source/drain and the second source/drain respectively,
an upper protrusion portion protruding upward from a top surface of the base portion, and
a lower protrusion portion protruding downward from a bottom surface of the base portion,
wherein a direction from a bottom end of the lower protrusion portion to a top end of the upper protrusion portion is oblique with respect to a vertical direction that is perpendicular to the horizontal direction, the opposite side surfaces of the base portion are oblique with respect to the vertical direction that is perpendicular to the horizontal direction, each of the opposite side surfaces of the base portion being curved in the vertical direction, and
wherein
the first source/drain is a source and the second source/drain is a drain, or
the first source/drain is a drain and the second source/drain is a source.

2. The semiconductor device of claim 1, wherein the upper protrusion portion contacts the upper inner spacer and the gate, and
the lower protrusion portion contacts the lower inner spacer and the gate.

3. The semiconductor device of claim 1, wherein
the upper inner spacer includes a first inner surface contacting the gate and a first outer surface opposing the first inner surface,
a length of the first outer surface in the vertical direction is greater than a length of the first inner surface in the vertical direction,
the lower inner spacer includes a second inner surface contacting the gate and a second outer surface opposing the second inner surface, and
a length of the second outer surface in the vertical direction is greater than a length of the second inner surface in the vertical direction.

4. The semiconductor device of claim 1, wherein, in a cross-sectional view where the semiconductor device is cut away in parallel to the horizontal direction and the vertical direction,
the upper protrusion portion is a triangle and the lower protrusion portion is an inverted triangle.

5. The semiconductor device of claim 1, wherein, in a cross-sectional view where the semiconductor device is cut away in parallel to the horizontal direction and the vertical direction,
the gate includes a lower portion under the channel and an upper portion above the channel, and
a length of the upper portion of the gate in the horizontal direction is less than a length of the lower portion of the gate in the horizontal direction.

6. The semiconductor device of claim 1, wherein, in a cross-sectional view where the semiconductor device is cut away in parallel to the horizontal direction and the vertical direction,
the gate includes a lower portion under the channel and an upper portion above the channel, and
a side surface of the upper portion of the gate and a side surface of the lower portion of the gate are dented inward.

7. The semiconductor device of claim 1, wherein, in a cross-sectional view where the semiconductor device is cut away in parallel to the horizontal direction and the vertical direction, the gate includes a lower portion under the channel and an upper portion above the channel, a top surface of the lower inner spacer has a shape descending, in the vertical direction, with increasing proximity to the lower portion of the gate, and a bottom surface of the upper inner spacer has a shape ascending, in the vertical direction, with increasing proximity to the upper portion of the gate.

8. The semiconductor device of claim 1, wherein, in a cross-sectional view where the semiconductor device is cut away in parallel to the horizontal direction and the vertical direction, the gate includes a lower portion under the channel and an upper portion above the channel, a part of a top surface of the lower portion of the gate adjacent to the lower inner spacer has a shape descending, in the vertical direction, with increasing proximity to the lower inner spacer, and a part of a bottom surface of the upper portion of the gate adjacent to the upper inner spacer has a shape ascending, in the vertical direction, with increasing proximity to the upper inner spacer.

9. The semiconductor device of claim 1, wherein, in a cross-sectional view where the semiconductor device is cut away in parallel to the horizontal direction and the vertical direction, a boundary between the channel and the first source/drain extends between a bottom surface of the upper inner spacer and a top surface of the lower inner spacer.

10. The semiconductor device of claim 1, wherein an end portion of the first source/drain contacting the channel extends between the upper inner spacer and the lower inner spacer.

11. A semiconductor device, comprising:
a first source/drain;
a second source/drain isolated from direct contact with the first source/drain in a horizontal direction;
a channel extending between the first source/drain and the second source/drain;
a gate surrounding the channel;
a first upper inner spacer between the gate and the first source/drain and above the channel;
a second upper inner spacer between the gate and the second source/drain and above the channel;
a first lower inner spacer between the gate and the first source/drain and under the channel; and
a second lower inner spacer between the gate and the second source/drain and under the channel,
wherein the channel includes
a base portion extending between the first source/drain and the second source/drain such that opposite side surfaces of the base portion are directly contacting the first source/drain and the second source/drain respectively,
first and second upper protrusion portions each protruding upward from a top surface of the base portion, and
first and second lower protrusion portions each protruding downward from a bottom surface of the base portion,
wherein a distance in the horizontal direction between a top end of the first upper protrusion portion and a top end of the second upper protrusion portion is less than a distance in the horizontal direction between a bottom end of the first lower protrusion portion and a bottom end of the second lower protrusion portion, the opposite side surfaces of the base portion are oblique with respect to a vertical direction that is perpendicular to the horizontal direction, each of the opposite side surfaces of the base portion being curved in the vertical direction, and wherein
the first source/drain is a source and the second source/drain is a drain, or
the first source/drain is a drain and the second source/drain is a source.

12. The semiconductor device of claim 11, wherein
the top end of the first upper protrusion portion is between the first upper inner spacer and the gate,
the top end of the second upper protrusion portion is between the second upper inner spacer and the gate,
the bottom end of the first lower protrusion portion is between the first lower inner spacer and the gate, and
the bottom end of the second lower protrusion portion is between the second lower inner spacer and the gate.

13. The semiconductor device of claim 11, wherein
an outer surface of the first upper inner spacer is dented toward an inner surface of the first upper inner spacer,
an outer surface of the second upper inner spacer is dented toward an inner surface of the second upper inner spacer,
an outer surface of the first lower inner spacer is dented toward an inner surface of the first lower inner spacer, and
an outer surface of the second lower inner spacer is dented toward an inner surface of the second lower inner spacer.

14. The semiconductor device of claim 13, wherein a length of the channel in the horizontal direction is less than a distance in the horizontal direction between the outer surface of the first lower inner spacer and the outer surface of the second lower inner spacer.

15. The semiconductor device of claim 14, wherein the length of the channel in the horizontal direction is greater than a distance in the horizontal direction between the inner surface of the first lower inner spacer and the inner surface of the second lower inner spacer.

16. A semiconductor device, comprising:
a first source/drain;
a second source/drain isolated from direct contact with the first source/drain in a horizontal direction;
a lower channel extending between the first source/drain and the second source/drain;
an upper channel extending between the first source/drain and the second source/drain and isolated from direct contact with the lower channel in a vertical direction;
a gate surrounding the lower channel and the upper channel;
a first inner spacer between the gate and the first source/drain and between the lower channel and the upper channel; and
a second inner spacer between the gate and the second source/drain and between the lower channel and the upper channel,
wherein the lower channel includes
a lower base portion extending between the first source/drain and the second source/drain such that opposite side surfaces of the lower base portion are directly contacting the first source/drain and the second source/drain respectively,
an upper protrusion portion protruding upward from a top surface of the lower base portion, and
a first lower protrusion portion protruding downward from a bottom surface of the lower base portion, wherein a direction from a bottom end of the first lower protrusion portion to a top end of the upper protrusion portion is oblique with respect to the vertical direction, the opposite side surfaces of the lower base portion are oblique with respect to the vertical direction that is perpendicular to the horizontal direction each of the opposite side surfaces of the lower base portion being curved in the vertical direction, and wherein
- the first source/drain is a source and the second source/drain is a drain, or
- the first source/drain is a drain and the second source/drain is a source.

17. The semiconductor device of claim 16, wherein the upper channel includes
   an upper base portion extending between the first source/drain and the second source/drain, and
   a second lower protrusion portion protruding downward from a bottom surface of the upper base portion.

18. The semiconductor device of claim 17, wherein a direction in which a bottom end of the second lower protrusion portion is isolated from direct contact with the top end of the upper protrusion portion is parallel to the vertical direction.

19. The semiconductor device of claim 16, wherein a top surface of the upper channel is flat.

20. The semiconductor device of claim 16, wherein a length of the upper channel in the horizontal direction is less than a length of the lower channel in the horizontal direction.

* * * * *